United States Patent
Takahashi

(10) Patent No.: US 10,986,291 B2
(45) Date of Patent: Apr. 20, 2021

(54) SOLID-STATE IMAGE PICKUP DEVICE AND CONTROL METHOD OF SOLID-STATE IMAGE PICKUP DEVICE

(71) Applicants: Kabushiki Kaisha Toshiba, Minato-ku (JP); Toshiba Electronic Devices & Storage Corporation, Minato-ku (JP)

(72) Inventor: Masao Takahashi, Zama (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/807,246

(22) Filed: Mar. 3, 2020

(65) Prior Publication Data

US 2020/0304738 A1  Sep. 24, 2020

(30) Foreign Application Priority Data

Mar. 20, 2019  (JP) .............................. JP2019-053645

(51) Int. Cl.
*H04N 5/359* (2011.01)
*H01L 27/148* (2006.01)
(Continued)

(52) U.S. Cl.
CPC ..... *H04N 5/3591* (2013.01); *H01L 27/14812* (2013.01); *H01L 27/14825* (2013.01);
(Continued)

(58) Field of Classification Search
CPC ............. H04N 5/3591; H04N 5/37213; H04N 9/0455; H04N 5/3597; H04N 5/372;
(Continued)

(56) References Cited

U.S. PATENT DOCUMENTS 5,631,702 A * 5/1997 Miwada ............ H01L 27/14825
257/232
5,751,032 A * 5/1998 Yu ..................... H01L 27/14868
257/233

(Continued)

FOREIGN PATENT DOCUMENTS

JP         09-181298 A    7/1997
JP       2006-174337 A    6/2006
JP          5787848 B2    9/2015

*Primary Examiner* — Albert H Cutler
(74) *Attorney, Agent, or Firm* — Oblon, McClelland, Maier & Neustadt, L.L.P.

(57) ABSTRACT

A solid-state image pickup device according to an embodiment is a solid-state image pickup device including a first pixel row, a second pixel row, and a third pixel row that are arranged in a horizontal direction. In the solid-state image pickup device, a first control pulse for transferring charges of first accumulation portions of the fourth and sixth CCD registers in a vertical direction perpendicular to the horizontal direction and a second control pulse for transferring charges of second accumulation portions of the fourth and sixth CCD registers in the horizontal direction are input to the fourth and sixth CCD registers such that an Hi period of the first control pulse and an Hi period of the second control pulse do not overlap each other in a timing period in which charges accumulated in the first, second, and third pixel rows are transferred.

6 Claims, 20 Drawing Sheets

(51) Int. Cl.
*H04N 5/372* (2011.01)
*H04N 9/04* (2006.01)

(52) U.S. Cl.
CPC ..... *H01L 27/14887* (2013.01); *H04N 5/3597* (2013.01); *H04N 5/37213* (2013.01); *H04N 9/0455* (2018.08)

(58) Field of Classification Search
CPC .............. H04N 5/3692; H04N 5/3694; H04N 5/37206; H01L 27/14887; H01L 27/14825; H01L 27/14812; H01L 27/148; H01L 27/14806
USPC .................................................. 348/282, 283
See application file for complete search history.

(56) References Cited

U.S. PATENT DOCUMENTS

| | | | | |
|---|---|---|---|---|
| 5,784,101 A * | 7/1998 | Hasegawa | ............ | H04N 5/3692 348/282 |
| 5,995,249 A * | 11/1999 | Sato | ............ | H04N 5/3692 358/514 |
| 6,593,968 B1 * | 7/2003 | Ichikawa | ............ | H01L 27/14806 257/234 |
| 8,102,455 B2 * | 1/2012 | Parks | ............ | H04N 5/347 348/311 |
| 8,993,950 B2 | 3/2015 | Takahashi | | |
| 2005/0225663 A1 * | 10/2005 | Tsuzuki | ............ | H01L 27/14621 348/362 |
| 2008/0211953 A1 * | 9/2008 | Ikehata | ............ | H04N 5/343 348/311 |

* cited by examiner

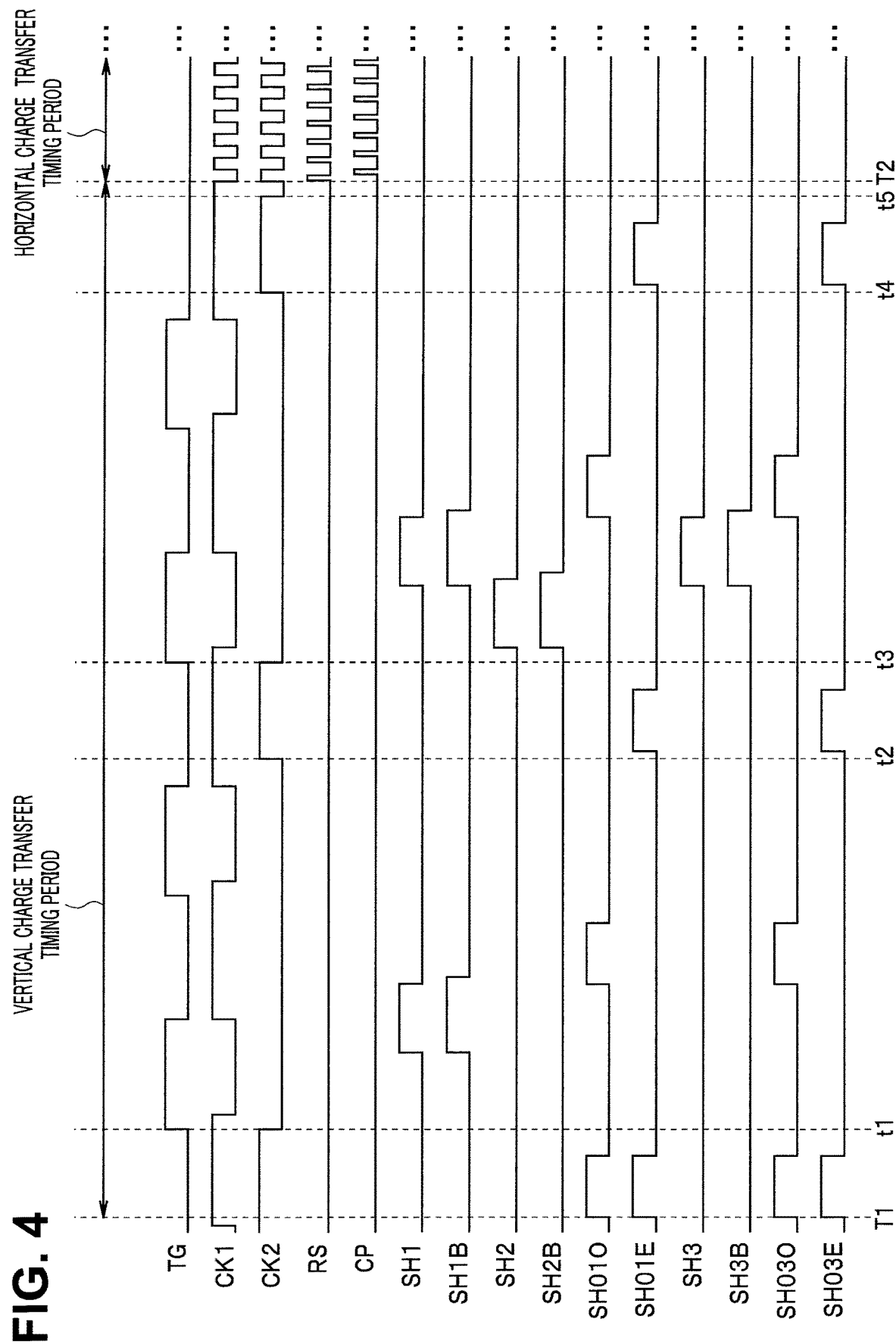

SOLID-STATE IMAGE PICKUP DEVICE AND CONTROL METHOD OF SOLID-STATE IMAGE PICKUP DEVICE

CROSS-REFERENCE TO RELATED APPLICATION

This application is based upon and claims the benefit of priority from the prior Japanese Patent Application No. 2019-053645 filed on Mar. 20, 2019; the entire contents of which are incorporated herein by reference.

FIELD

Embodiments described herein relate generally to a solid-state image pickup device and a control method of a solid-state image pickup device.

BACKGROUND

A linear image sensor is a solid-state image pickup device that one-dimensionally reads image information, converts the read image information into an analog signal, and outputs the converted analog signal in a time series. The linear image sensor is known as a device required to read an image, for example, a facsimile, a digital copying machine, or an image scanner. In addition, as the solid-state image pickup device, a three-line solid-state image pickup device in which the distance between pixel rows is two lines and pixel rows of three lines of RGB are provided is known.

In the three-line solid-state image pickup device in which the distance between pixel rows is two lines, in the related art, at a vertical transfer pulse timing of signal charges, before completing a vertical transfer operation when the charge amount is large, a phenomenon (blooming) in which charges leak to one-bit-prior pixels in a CCD register occurs. Further, the saturated charge amount of the CCD register may decrease. In addition, when blooming is avoided by adjusting the timing, the vertical transfer time increases.

BRIEF DESCRIPTION OF THE DRAWINGS

FIG. 4 is a waveform chart illustrating an example of a pulse timing of charge transfer in the related art;

DETAILED DESCRIPTION

A solid-state image pickup device according to an embodiment includes a first pixel row, a second pixel row, and a third pixel row, in which a distance between the first pixel row and the second pixel row and a distance between the second pixel row and the third pixel row are two lines. In the solid-state image pickup device, a first control pulse input to first accumulation portions of first to sixth CCD registers and a second control pulse input to second accumulation portions are input to the first to sixth CCD registers such that an Hi period of the first control pulse and an Hi period of the second control pulse do not overlap each other in a vertical transfer timing period in which charges accumulated in the first, second, and third pixel rows are vertically transferred.

Hereinafter, embodiments will be described in detail with reference to the drawings.

First Embodiment

First, a configuration of a solid-state image pickup device according to a first embodiment will be described with reference to FIG. 1.

Figure 1:
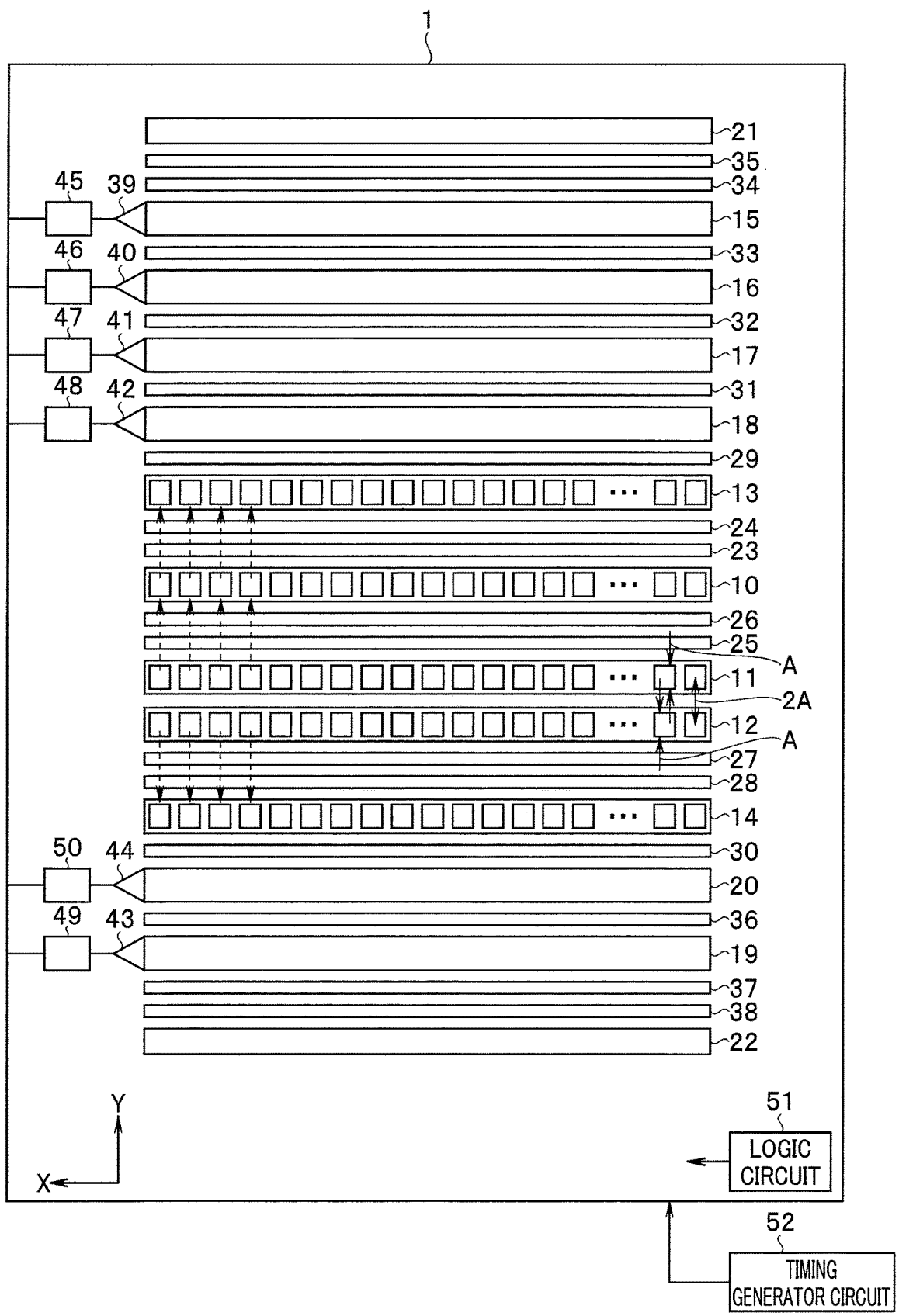
FIG. 1 is a diagram illustrating an example of a configuration of a solid-state image pickup device according to a first embodiment.

FIG. 1 is a diagram illustrating an example of the configuration of the solid-state image pickup device according to the first embodiment.

A solid-state image pickup device 1 according to the embodiment includes a first pixel row 10, a second pixel row 11, a third pixel row 12, a first ST portion 13, a second ST portion 14, a first CCD register 15, a second CCD register 16, a third CCD register 17, a fourth CCD register 18, a fifth CCD register 19, a sixth CCD register 20, a first drain portion 21, and a second drain portion 22.

The solid-state image pickup device 1 according to the embodiment is a three-line solid-state image pickup device including three pixel rows of RGB, in which a blue (B) color filter is provided on the first pixel row 10, a green (G) color filter is provided on the second pixel row 11, and a red (R) color filter is provided on the third pixel row 12. In other words, the first pixel row 10 is a pixel row corresponding to blue, the second pixel row 11 is a pixel row corresponding to green, and the third pixel row 12 is a pixel row corresponding to red.

In addition, in the solid-state image pickup device according to the embodiment, the distance between pixel rows is two lines. Specifically, as illustrated in FIG. 1, when the length of a pixel of the second pixel row 11 and the third pixel row 12 in a Y-axis direction (longitudinal direction) is represented by A, the distance between pixel rows (distance between lines) is two lines in a case where the distance between the center of a pixel of the second pixel row 11 and the center of a pixel of the third pixel row 12 in the Y-axis direction (longitudinal direction) is 2A. In the embodiment, the distance between the first pixel row 10 and the second pixel row 11 is two lines. In this way, the solid-state image pickup device 1 according to the embodiment is the three-line solid-state image pickup device in which the distance between pixel rows is two lines.

An SH1 gate 23 and an SH1B gate 24 are arranged between the first pixel row 10 and the first ST portion 13. An SH2 gate 25 and an SH2B gate 26 are arranged between the first pixel row 10 and the second pixel row 11. An SH3 gate 27 and an SH3B gate 28 are arranged between the third pixel row 12 and the second ST portion 14.

An SH01O/SH01E gate 29 is arranged between the first ST portion 13 and the fourth CCD register 18. An SH03O/SH03E gate 30 is arranged between the second ST portion 14 and the sixth CCD register 20.

A TG gate portion 31 is arranged between the fourth CCD register 18 and the third CCD register 17. A TG gate portion 32 is arranged between the third CCD register 17 and the second CCD register 16. A TG gate portion 33 is arranged between the second CCD register 16 and the first CCD register 15. A TG gate portion 34 and a DG gate portion 35 are arranged between the first CCD register 15 and the first drain portion 21.

A TG gate portion 36 is arranged between the sixth CCD register 20 and the fifth CCD register 19. A TG gate portion 37 and a DG gate portion 38 are arranged between the fifth CCD register 19 and the second drain portion 22.

The solid-state image pickup device 1 includes a first FD portion 39 that is a first conversion portion, a second FD portion 40 that is a second conversion portion, a third FD portion 41 that is a third conversion portion, a fourth FD portion 42 that is a fourth conversion portion, a fifth FD portion 43 that is a fifth conversion portion, a sixth FD portion 44 that is a sixth conversion portion, a first clamping circuit 45, a second clamping circuit 46, a third clamping circuit 47, a fourth clamping circuit 48, a fifth clamping circuit 49, and a sixth clamping circuit 50.

Charges accumulated in the first pixel row 10 and the second pixel row 11 are vertically transferred in a first direction (upper direction of the Y-axis in FIG. 1). On the other hand, charges accumulated in the third pixel row 12 are vertically transferred in a second direction (lower direction of the Y-axis in FIG. 1) that is a direction opposite to the first direction by 180°.

Charges of odd-numbered pixels of the first pixel row 10 are vertically transferred to and held in the first CCD register 15. Charges of even-numbered pixels of the first pixel row 10 are vertically transferred to and held in the second CCD register 16.

Charges of odd-numbered pixels of the second pixel row 11 are vertically transferred to and held in the third CCD register 17. Charges of even-numbered pixels of the second pixel row 11 are vertically transferred to and held in the fourth CCD register 18.

Charges of odd-numbered pixels of the third pixel row 12 are vertically transferred to and held in the fifth CCD register 19. Charges of even-numbered pixels of the third pixel row 12 are vertically transferred to and held in the sixth CCD register 20.

Charges vertically transferred to the first CCD register 15 are horizontally transferred to the first FD portion 39, the transferred charges are converted into a voltage signal by the first FD portion 39, and the voltage signal is input to the first clamping circuit 45. The first clamping circuit 45 clamps the input voltage signal, that is, suppresses the voltage signal to obtain a predetermined voltage amplitude and outputs the suppressed voltage signal.

Charges vertically transferred to the second CCD register 16 are horizontally transferred to the second FD portion 40, the transferred charges are converted into a voltage signal by the second FD portion 40, and the voltage signal is input to the second clamping circuit 46. The second clamping circuit 46 clamps the input voltage signal and outputs the clamped voltage signal.

Charges vertically transferred to the third CCD register 17 are horizontally transferred to the third FD portion 41, the transferred charges are converted into a voltage signal by the third FD portion 41, and the voltage signal is input to the third clamping circuit 47. The third clamping circuit 47 clamps the input voltage signal and outputs the clamped voltage signal.

Charges vertically transferred to the fourth CCD register 18 are horizontally transferred to the fourth FD portion 42, the transferred charges are converted into a voltage signal by the fourth FD portion 42, and the voltage signal is input to the fourth clamping circuit 48. The fourth clamping circuit 48 clamps the input voltage signal and outputs the clamped voltage signal.

Charges vertically transferred to the fifth CCD register 19 are horizontally transferred to the fifth FD portion 43, the transferred charges are converted into a voltage signal by the fifth FD portion 43, and the voltage signal is input to the fifth clamping circuit 49. The fifth clamping circuit 49 clamps the input voltage signal and outputs the clamped voltage signal.

Charges vertically transferred to the sixth CCD register 20 are horizontally transferred to the sixth FD portion 44, the transferred charges are converted into a voltage signal by the sixth FD portion 44, and the voltage signal is input to the sixth clamping circuit 50. The sixth clamping circuit 50 clamps the input voltage signal and outputs the clamped voltage signal.

The solid-state image pickup device 1 includes a logic circuit 51. The logic circuit 51 executes ON/OFF control of the SH1 gate 23, the SH1B gate 24, the SH2 gate 25, the SH2B gate 26, the SH3 gate 27, the SH3B gate 28, the SH01O/SH01E gate 29, and the SH03O/SH03E gate 30.

A timing generator circuit 52 is provided outside the solid-state image pickup device 1. The timing generator circuit 52 outputs timing signals (pulse signals) to the first CCD register 15, the second CCD register 16, the third CCD register 17, the fourth CCD register 18, the fifth CCD register 19, and the sixth CCD register 20, the TG gate portion 31, the TG gate portion 32, the TG gate portion 33, the TG gate portion 34, the TG gate portion 36, and the TG gate portion 37.

The timing generator circuit 52 outputs timing signals (pulse signals) to the first FD portion 39, the second FD portion 40, the third FD portion 41, the fourth FD portion 42, the fifth FD portion 43, the sixth FD portion 44, the first clamping circuit 45, the second clamping circuit 46, the third clamping circuit 47, the fourth clamping circuit 48, the fifth clamping circuit 49, and the sixth clamping circuit 50. The timing generator circuit 52 may be provided inside the solid-state image pickup device 1.

Next, a specific configuration of the solid-state image pickup device 1 will be described using FIGS. 2 and 3.

Figure 2:
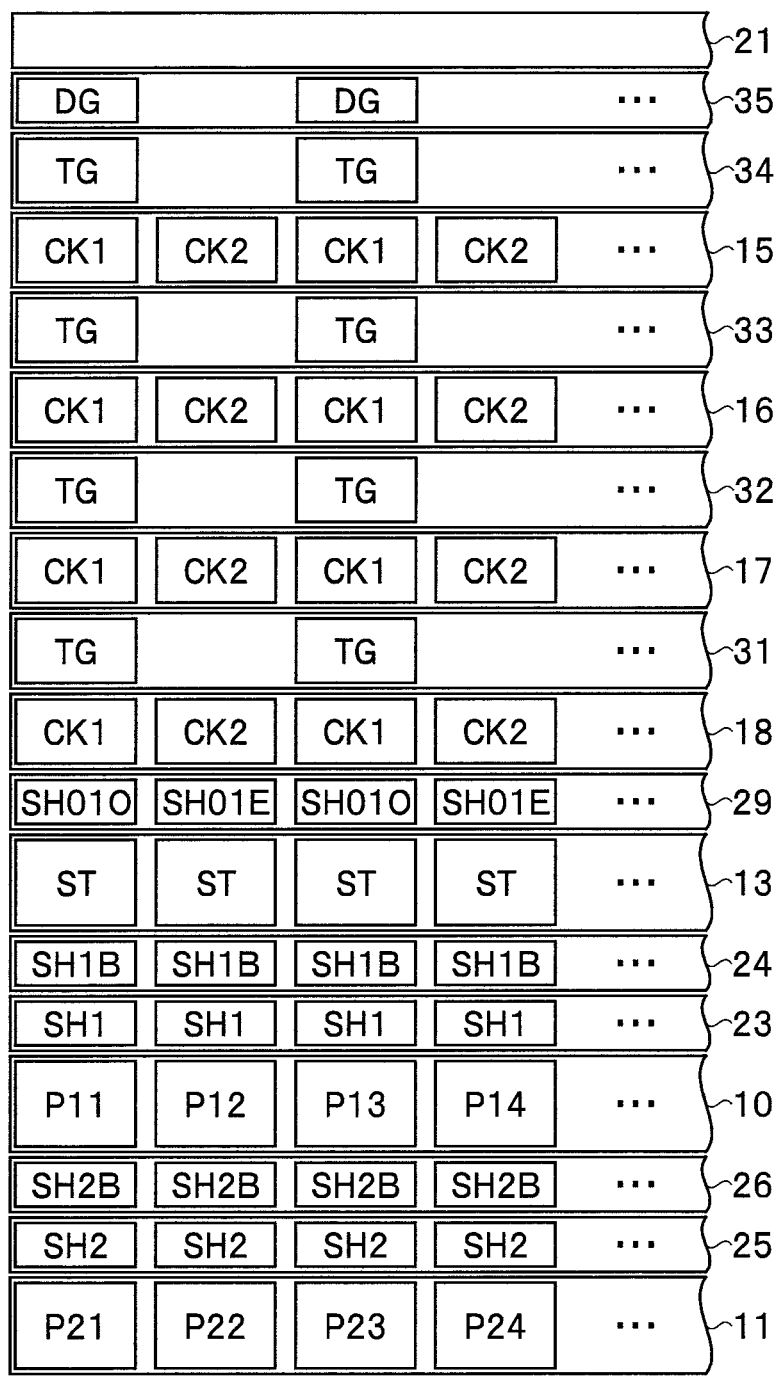
FIG. 2 is a schematic diagram illustrating an example of a specific configuration of an upper portion of a second pixel row regarding vertical charge transfer.

FIG. 2 is a schematic diagram illustrating an example of a specific configuration of an upper portion of a second pixel row regarding vertical charge transfer. FIGS. 2A to 2G are diagrams illustrating a state where charges of pixels of the first pixel row and charges of pixels of the second pixel row are moved. FIG. 3 is a schematic diagram illustrating an example of a specific configuration of a lower portion of the third pixel row regarding vertical charge transfer. FIGS. 3A to 3D are diagrams illustrating a state where charges of pixels of the third pixel row are moved.

As illustrated in FIG. 2, pixels P11, P12, P13, P14, . . . are arranged in a row in the first pixel row 10. Light is incident on each of the pixels of the first pixel row 10, and charges are accumulated according to the light incidence time. In the embodiment, odd-numbered pixels P11, P13, . . . from the left side toward FIG. 2 of the first pixel row 10 will be referred to as "odd-numbered pixels", and even-numbered pixels P12, P14, . . . from the left side toward FIG. 2 of the first pixel row 10 will be referred to as "even-numbered pixels". The same can also be applied to the second pixel row 11 and the third pixel row 12.

Figure 2A:
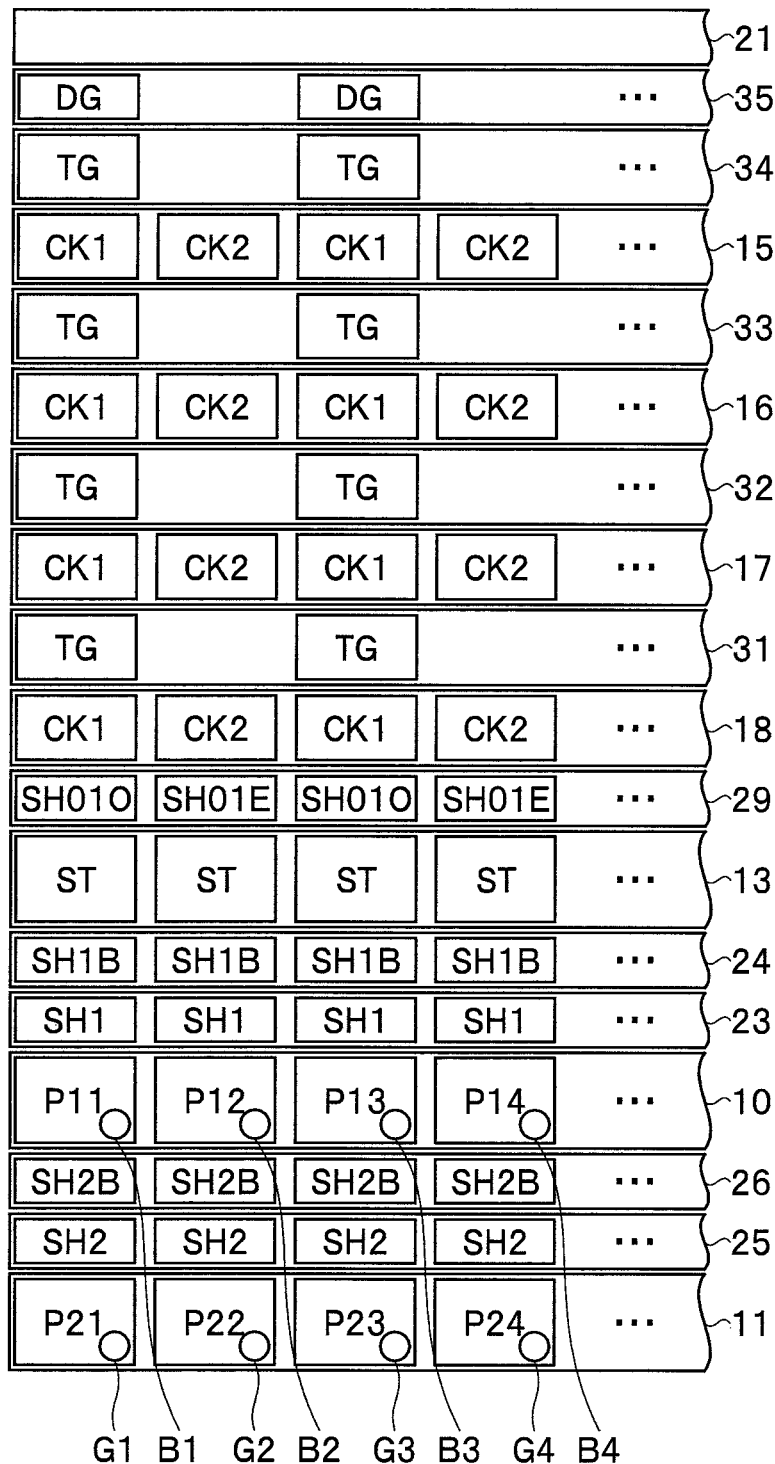
FIG. 2A is a diagram illustrating a state where charges of pixels of a first pixel row and charges of pixels of the second pixel row are moved.

As illustrated in FIG. 2A, charges B1, B2, B3, B4, . . . are accumulated in the pixels P11, P12, P13, P14, . . . of the first pixel row 10, respectively.

Figure 2B:
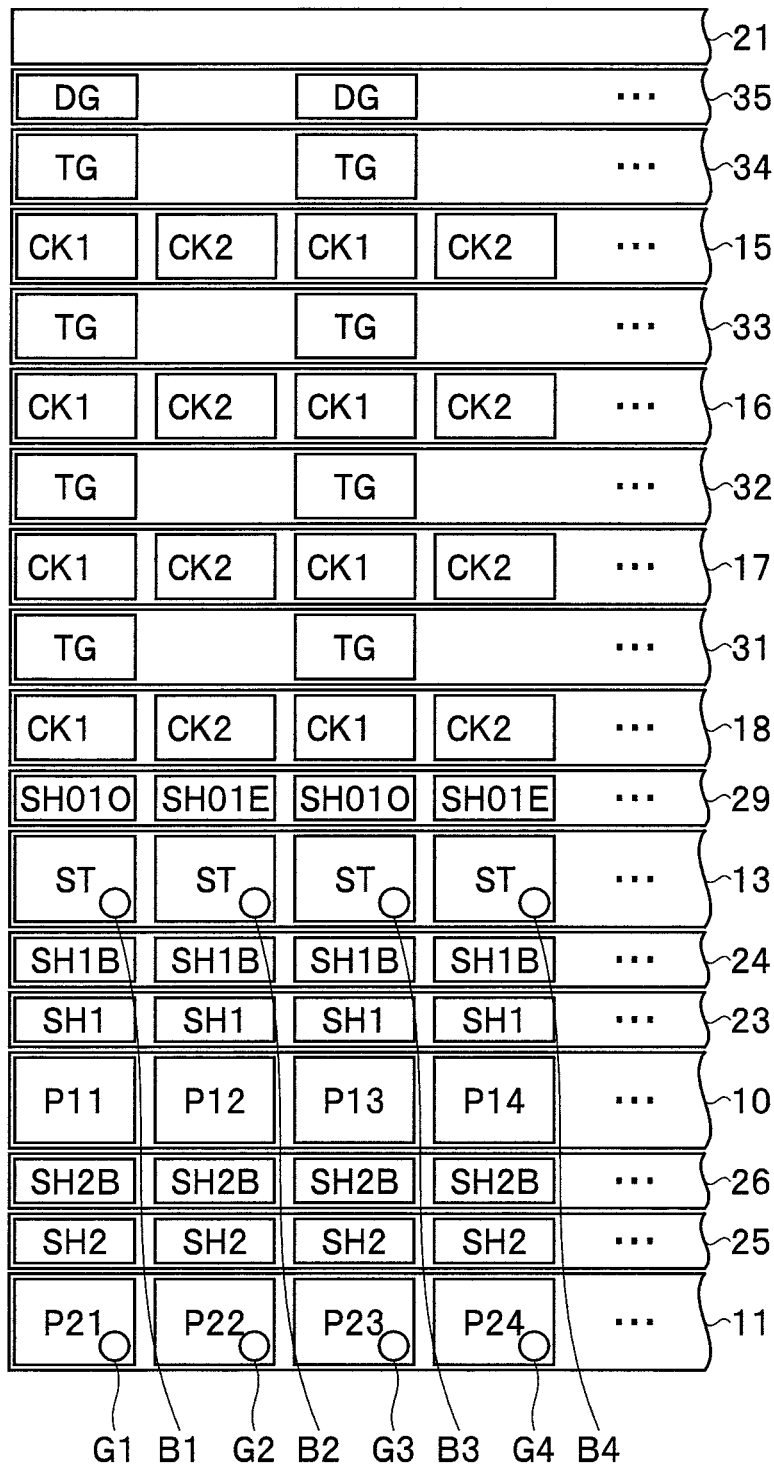
FIG. 2B is a diagram illustrating a state where charges of pixels of the first pixel row and charges of pixels of the second pixel row are moved.

The SH1 gate 23 is arranged above the first pixel row 10, and the SH1B gate 24 is arranged above the SH1 gate 23. As illustrated in FIG. 2B, the charges B1, B2, B3, B4, . . . of the pixels P11, P12, P13, P14, . . . of the first pixel row 10 are transferred to the first ST portion 13 in accordance with the ON/OFF control of the SH1 gate 23 and the SH1B gate 24.

The SH01O/SH01E gate 29 in which an SH01O gate and an SH01E gate are alternately arranged is arranged above the first ST portion 13. The charges (charges B1, B3, . . . ) of the odd-numbered pixels (pixels P11, P13, . . . ) of the first pixel row 10 that are accumulated in the first ST portion 13 are transferred to the fourth CCD register 18 in accordance with the ON/OFF control of the SH01O gates. The charges (charges G2, B4, . . . ) of the even-numbered pixels (pixels P12, P14, . . . ) of the first pixel row 10 that are accumulated in the first ST portion 13 are transferred to the fourth CCD register 18 in accordance with the ON/OFF control of the SH01E gates.

Figure 2C:
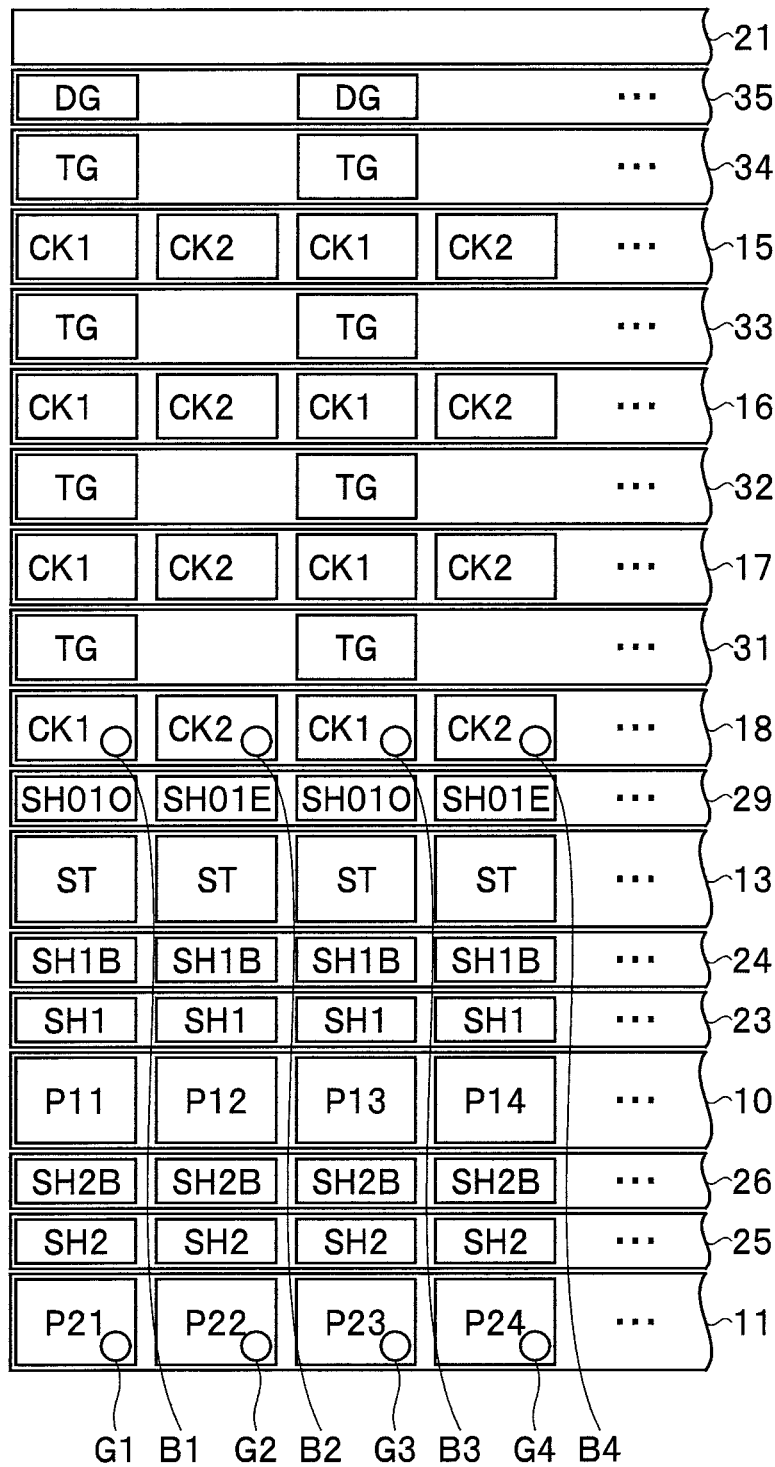
FIG. 2C is a diagram illustrating a state where charges of pixels of the first pixel row and charges of pixels of the second pixel row are moved.

In the fourth CCD register 18, an accumulation portion CK1 and an accumulation portion CK2 are alternately arranged. In other words, as illustrated in FIG. 2C, the charges (charges B1, B3, . . . ) of the odd-numbered pixels of the first pixel row 10 are accumulated in the accumulation portions CK1 of the fourth CCD register 18, and the charges (charges B2, B4, . . . ) of the even-numbered pixels of the first pixel row 10 are accumulated in the accumulation portions CK2 of the fourth CCD register 18.

Likewise, the first CCD register 15, the second CCD register 16, and the third CCD register 17 have the configuration in which the accumulation portion CK1 and the accumulation portion CK2 are alternately arranged.

A TG gate of the TG gate portion 31 is arranged between the accumulation portion CK1 of the fourth CCD register 18 and the accumulation portion CK1 of the third CCD register 17. Likewise, a TG gate of the TG gate portion 32 is arranged between the accumulation portion CK1 of the third CCD register 17 and the accumulation portion CK1 of the second CCD register 16. Likewise, a TG gate of the TG gate portion 33 is arranged between the accumulation portion CK1 of the second CCD register 16 and the accumulation portion CK1 of the first CCD register 15.

A TG gate of the TG gate portion 34 is arranged above the accumulation portion CK1 of the first CCD register 15. A DG gate of the DG gate portion 35 is arranged above the TG gate of the TG gate portion 34. The TG gates of the TG gate portion 34 and the DG gates of the DG gate portion 35 have a function of discharging dark charges to the first drain portion 21 in accordance with the ON/OFF control, the dark charges being accumulated in the first ST portion 13 and vertically transferred to the first CCD register 15.

Figure 2D:
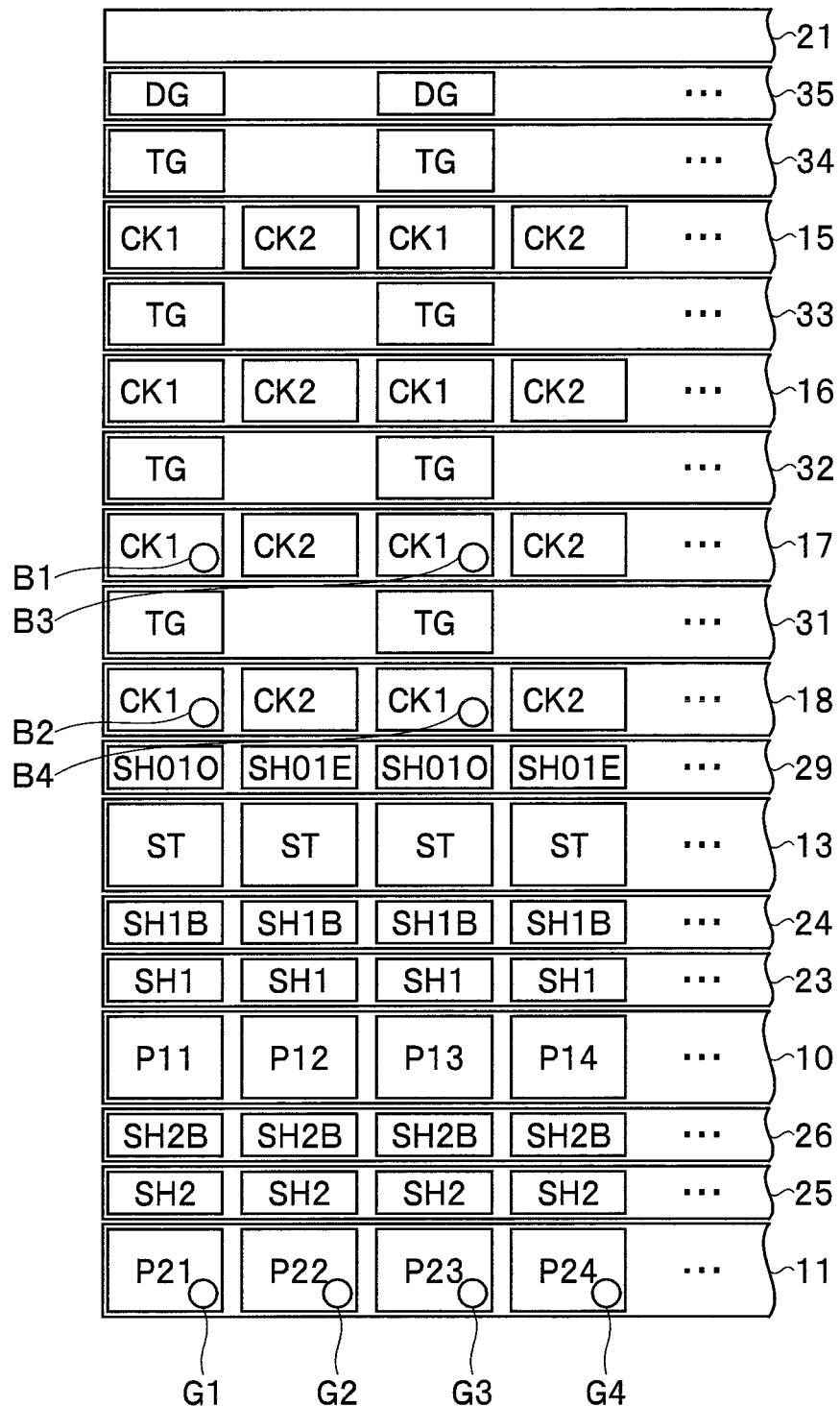
FIG. 2D is a diagram illustrating a state where charges of pixels of the first pixel row and charges of pixels of the second pixel row are moved.

As illustrated in FIG. 2D, the charges (charges B1, B3, . . . ) of the odd-numbered pixels of the first pixel row 10 that are accumulated in the accumulation portions CK1 of the fourth CCD register 18 are vertically transferred and accumulated in the accumulation portions CK1 of the third CCD register 17 in accordance with the ON/OFF control of CK1 pulses and the ON/OFF control of the respective TG gates of the TG gate portion 31.

The charges (charges B2, B4, . . . ) of the even-numbered pixels of the first pixel row 10 that are accumulated in the accumulation portions CK2 of the fourth CCD register 18 are horizontally transferred and accumulated in the accumulation portions CK1 of the fourth CCD register 18 in accordance with the ON/OFF control of CK2 pulses.

Figure 2E:
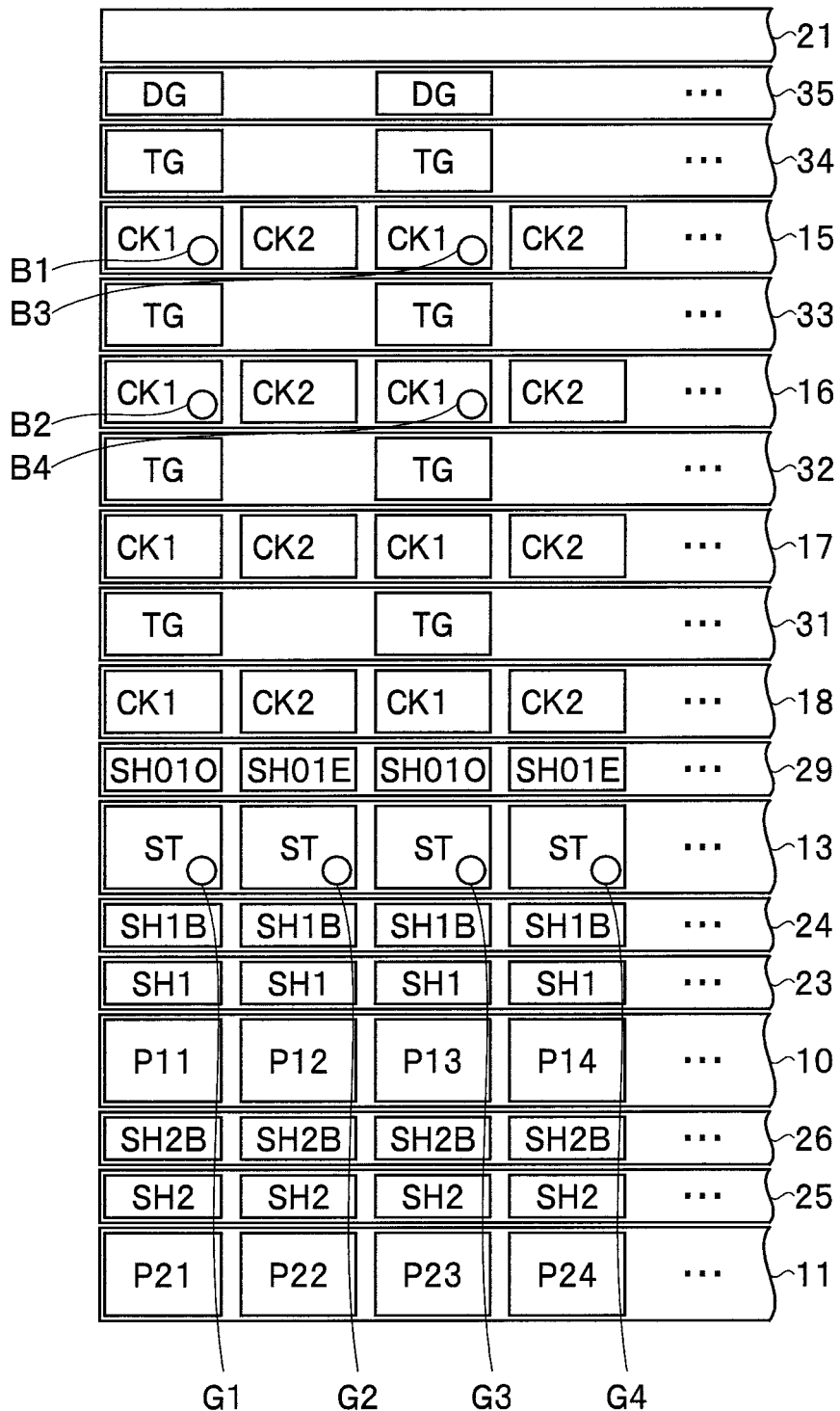
FIG. 2E is a diagram illustrating a state where charges of pixels of the first pixel row and charges of pixels of the second pixel row are moved.

As illustrated in FIG. 2E, the charges (charges B1, B2, . . . ) of the odd-numbered pixels of the first pixel row 10 that are accumulated in the accumulation portions CK1 of the third CCD register 17 are vertically transferred and accumulated in the accumulation portions CK1 of the first CCD register in accordance with the ON/OFF control of the respective TG gates of the TG gate portions 32 and 33. Likewise, the charges (charges B2, B4, . . . ) of the even-numbered pixels of the first pixel row 10 that are accumulated in the accumulation portions CK1 of the fourth CCD register 18 are vertically transferred and accumulated in the accumulation portions CK1 of the second CCD register 16 in accordance with the ON/OFF control of the respective TG gates of the TG gate portions 31 and 32.

Pixels P21, P22, P23, P24, . . . are arranged in a row in the second pixel row 11. Light is incident on each of the pixels of the second pixel row 11, and charges are accumulated according to the light incidence time.

As illustrated in FIG. 2A, charges G1, G2, G3, G4, . . . are accumulated in the pixels P21, P22, P23, P24, . . . of the second pixel row 11, respectively.

The SH2 gate 25 and the SH2B gate 26 are arranged between the first pixel row 10 and the second pixel row 11. As illustrated in FIG. 2E, the charges G1, G2, G3, G4, . . . that are accumulated in the pixels P21, P22, P23, P24, . . . of the second pixel row 11 are transferred to the first ST portion 13 in accordance with the ON/OFF control of the SH2 gate 25 and the SH2B gate 26 and the ON/OFF control of the SH1 gate 23 and the SH1B gate 24.

The charges (charges G1, G3, . . . ) of the odd-numbered pixels (pixels P21, P23, . . . ) of the second pixel row 11 that are accumulated in the first ST portion 13 are transferred to the fourth CCD register 18 in accordance with the ON/OFF control of the SH01O gates. The charges (charges G2, G4, . . . ) of the even-numbered pixels (pixels P22, P24, . . . ) of the second pixel row 11 that are accumulated in the first ST portion 13 are transferred to the fourth CCD register 18 in accordance with the ON/OFF control of the SH01E gates.

Figure 2F:
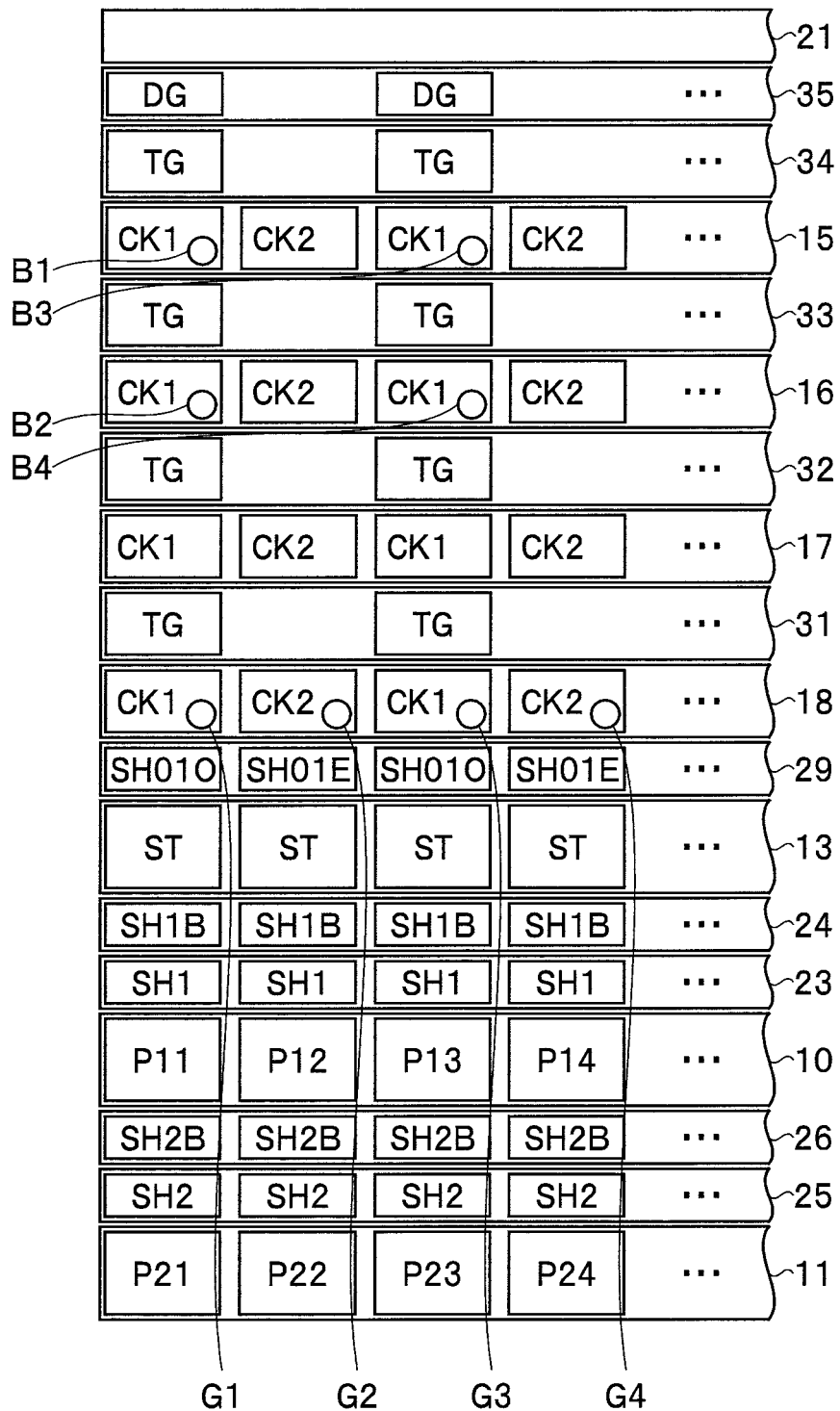
FIG. 2F is a diagram illustrating a state where charges of pixels of the first pixel row and charges of pixels of the second pixel row are moved.

As a result, as illustrated in FIG. 2F, the charges (charges G1, G3, . . . ) of the odd-numbered pixels of the second pixel row 11 are accumulated in the accumulation portions CK1 of the fourth CCD register 18, and the charges (charges G2, G4, . . . ) of the even-numbered pixels of the second pixel row 11 are accumulated in the accumulation portions CK2 of the fourth CCD register 18.

Figure 2G:
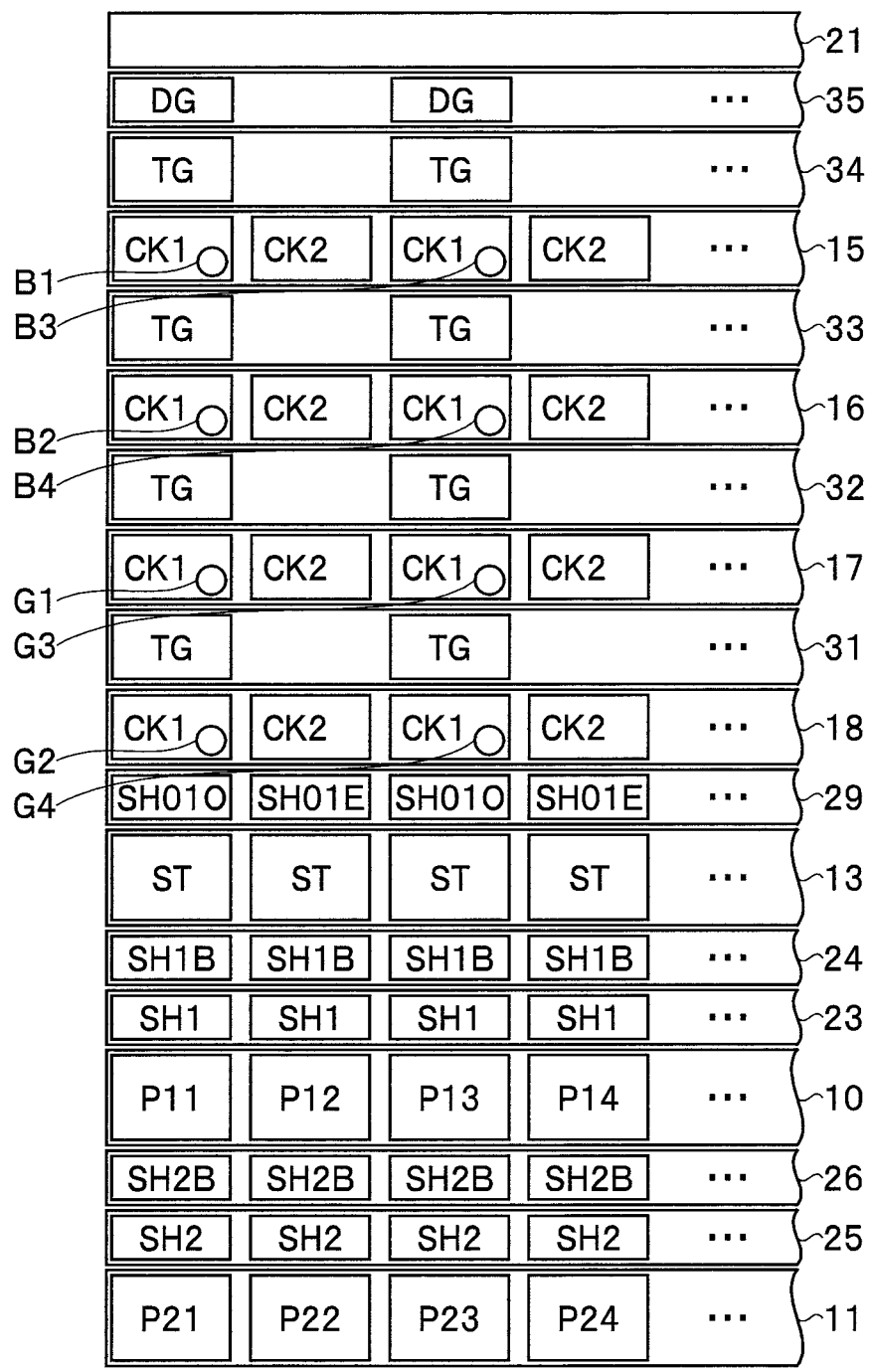
FIG. 2G is a diagram illustrating a state where charges of pixels of the first pixel row and charges of pixels of the second pixel row are moved.

As illustrated in FIG. 2G, the charges (charges GI, G3, . . . ) of the odd-numbered pixels of the second pixel row 11 that are accumulated in the accumulation portions CK1 of the fourth CCD register 18 are vertically transferred and accumulated in the accumulation portions CK1 of the third CCD register 17 in accordance with the ON/OFF control of CK1 pulses and the ON/OFF control of the respective TG gates of the TG gate portion 31. The charges (charges G2, G4, . . . ) of the even-numbered pixels of the second pixel row 11 that are accumulated in the accumulation portions CK2 of the fourth CCD register 18 are horizontally transferred and accumulated in the accumulation portions CK1 of the fourth CCD register 18 in accordance with the ON/OFF control of CK2 pulses.

As a result, as illustrated in FIG. 2G, the charges (charges B1, B3, . . . ) of the odd-numbered pixels of the first pixel row 10 are held in the first CCD register 15, and the charges (charges B2, B4, . . . ) of the even-numbered pixels of the first pixel row 10 are held in the second CCD register 16. The charges (charges G1, G3, . . . ) of the odd-numbered pixels of the second pixel row 11 are held in the third CCD register 17, and the charges (charges G2, G4, . . . ) of the even-numbered pixels of the second pixel row 11 are held in the fourth CCD register 18.

Figure 3:
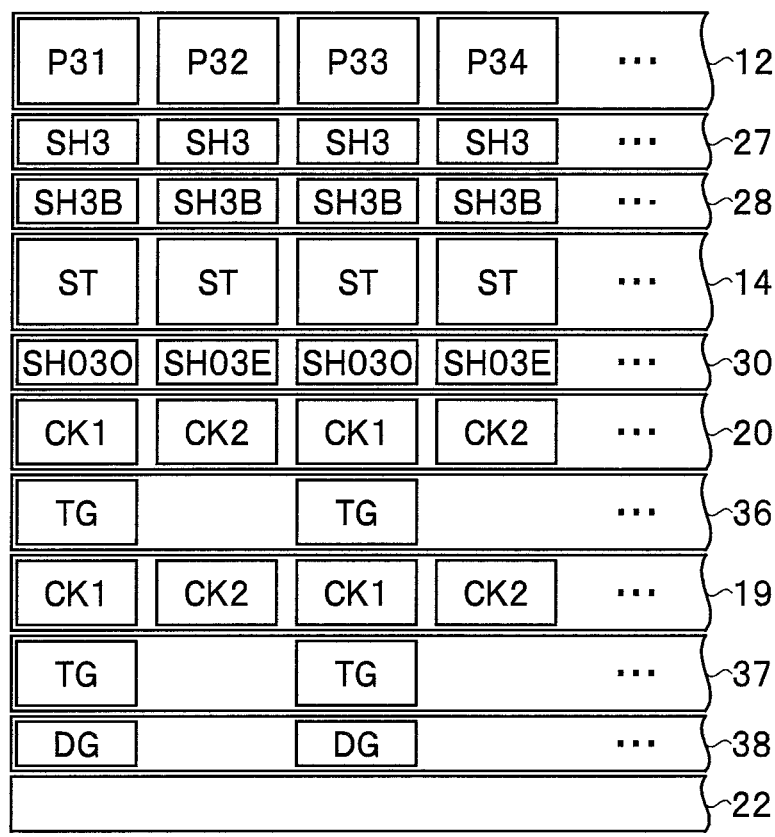
FIG. 3 is a schematic diagram illustrating an example of a specific configuration of a lower portion of a third pixel row regarding vertical charge transfer.

As illustrated in FIG. 3, pixels P31, P32, P33, P34, . . . are arranged in a row in the third pixel row 12. Light is incident on each of the pixels of the third pixel row 12, and charges are accumulated according to the light incidence time.

Figure 3A:
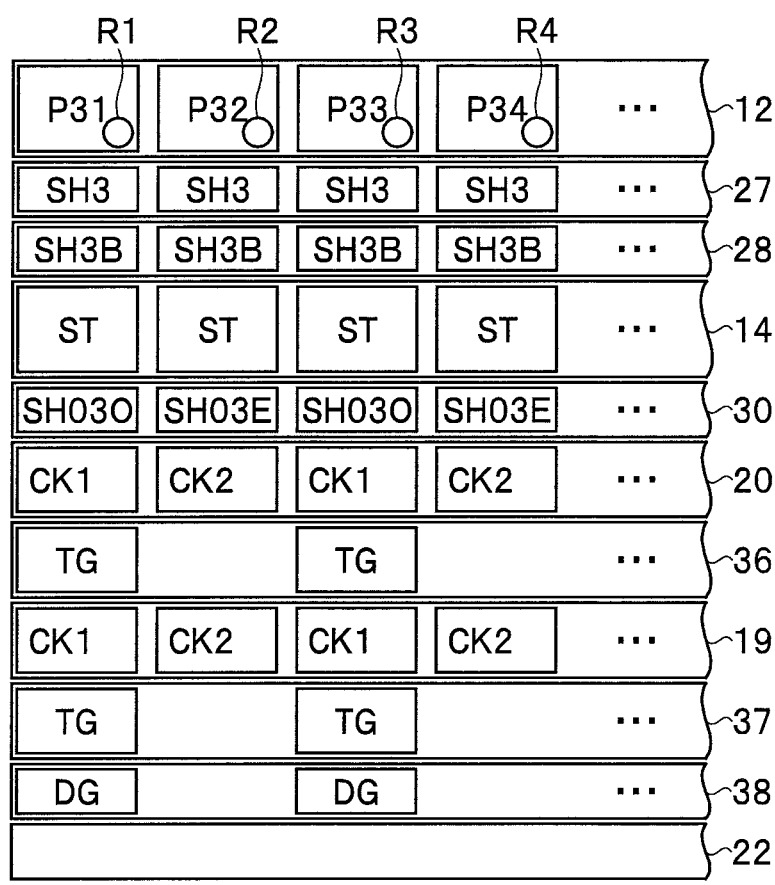
FIG. 3A is a diagram illustrating a state where charges of pixels of the third pixel row are moved.

As illustrated in FIG. 3A, charges R1, R2, R3, R4, . . . are accumulated in the pixels P31, P32, P33, P34, . . . of the third pixel row 12, respectively.

Figure 3B:
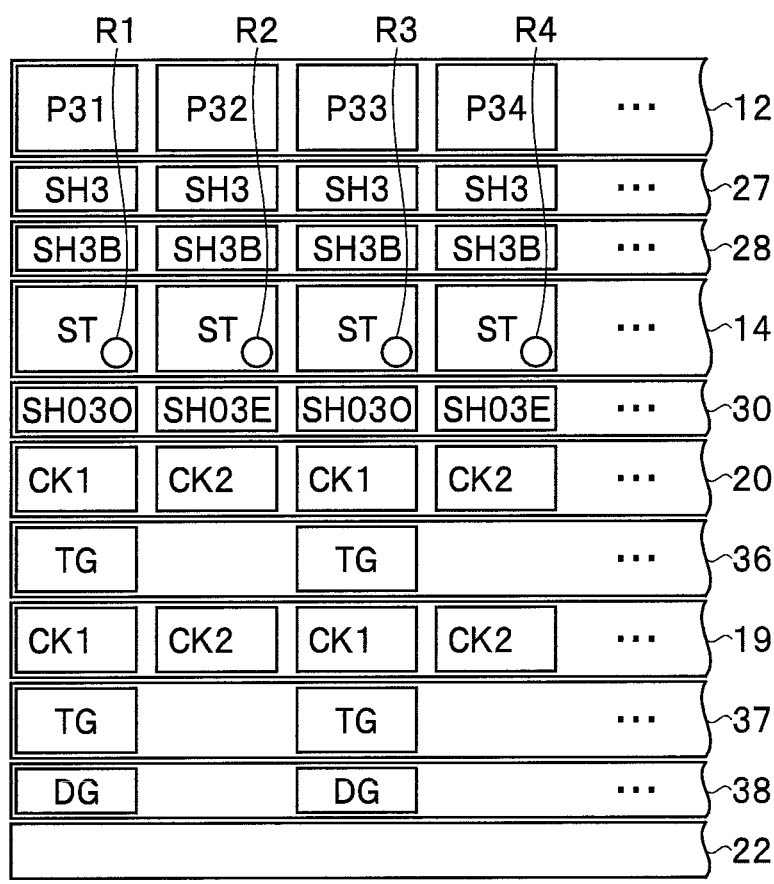
FIG. 3B is a diagram illustrating a state where charges of pixels of the third pixel row are moved.

The SH3 gate 27 and the SH3B gate 28 are arranged between the third pixel row 12 and the second ST portion 14. As illustrated in FIG. 3B, the charges R1, R2, R3, R4, . . . accumulated in the pixels P31, P32, P33, P34, . . . of the third pixel row 12 are transferred to the second ST portion 14 in accordance with the ON/OFF control of the SH3 gate 27 and the SH3B gate 28.

The SH03O/SH03E gate 30 in which an SH03O gate and an SH03E gate are alternately arranged is arranged below the second ST portion 14. The charges (charges R1, R3, . . . ) of the odd-numbered pixels (pixels P31, P33, . . . ) of the third pixel row 12 that are accumulated in the second ST portion 14 are transferred to the sixth CCD register 20 in accordance with the ON/OFF control of the SH03O gates. The charges (charges R2, R4, . . . ) of the even-numbered pixels (pixels P32, P34, . . . ) of the third pixel row 12 that are accumulated in the second ST portion 14 are transferred to the sixth CCD register 20 in accordance with the ON/OFF control of the SH03E gates.

Figure 3C:
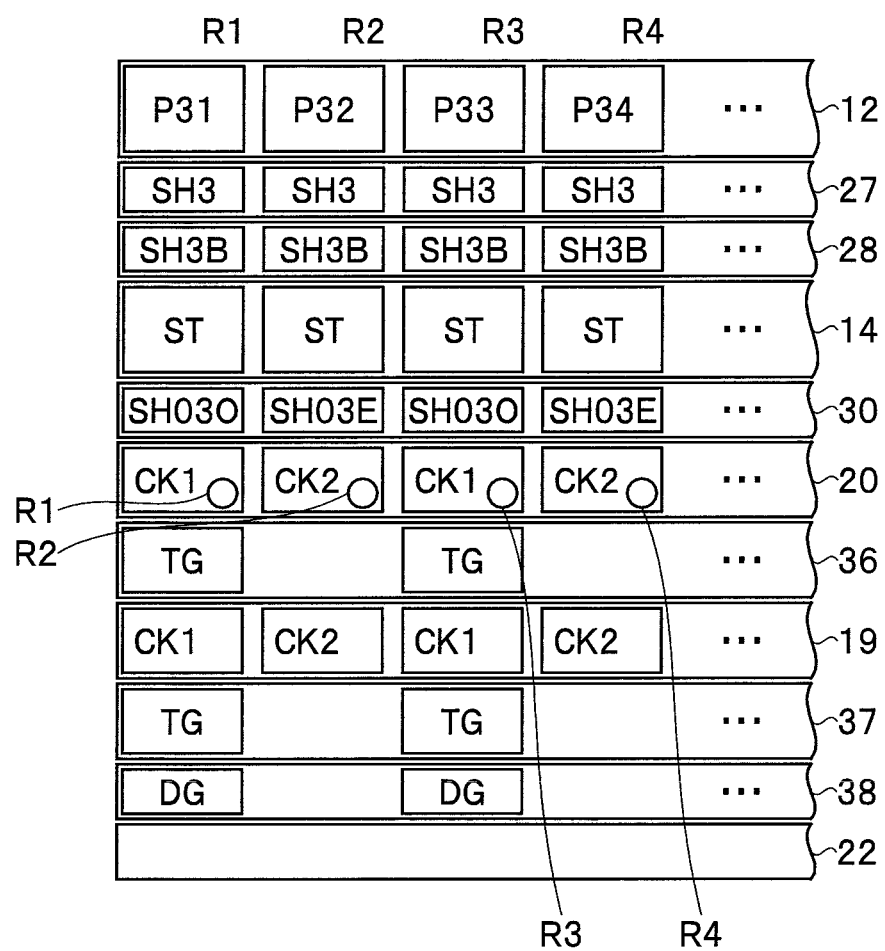
FIG. 3C is a diagram illustrating a state where charges of pixels of the third pixel row are moved.

In the sixth CCD register 20, an accumulation portion CK1 and an accumulation portion CK2 are alternately arranged. In other words, as illustrated in FIG. 3C, the charges (charges R1, R3, . . . ) of the odd-numbered pixels of the third pixel row 12 are accumulated in the accumulation portions CK1 of the sixth CCD register 20, and the charges (charges R2, R4, . . . ) of the even-numbered pixels of the third pixel row 12 are accumulated in the accumulation portions CK2 of the sixth CCD register 20.

Likewise, in the fifth CCD register 19, an accumulation portion CK1 and an accumulation portion CK2 are alternately arranged. A TG gate of the TG gate portion 36 is arranged between the accumulation portion CK1 of the sixth CCD register 20 and the accumulation portion CK1 of the fifth CCD register 19.

A TG gate of the TG gate portion 37 is arranged below the accumulation portion CK1 of the fifth CCD register 19. A DG gate of the DG gate portion 38 is arranged below the TG gate of the TG gate portion 37. The TG gates of the TG gate portion 37 and the DG gates of the DG gate portion 38 have a function of discharging dark charges to the second drain portion 22 in accordance with the ON/OFF control, the dark charges being accumulated in the second ST portion 14 and vertically transferred to the fifth CCD register 19.

Figure 3D:
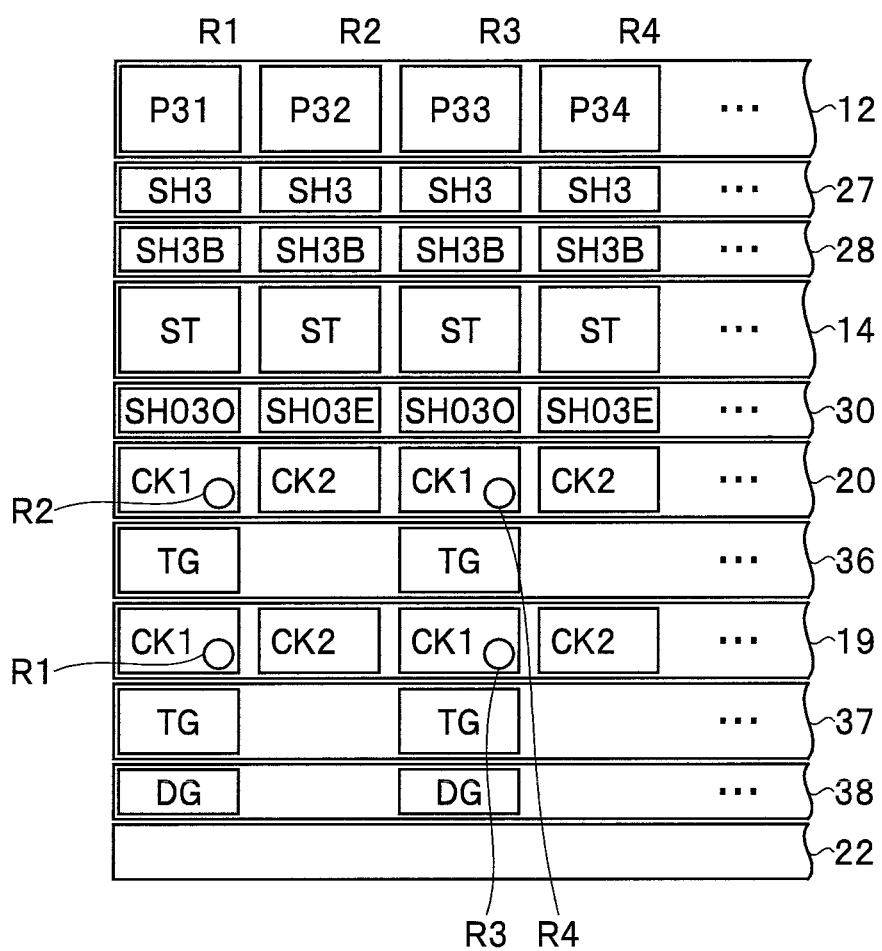
FIG. 3D is a diagram illustrating a state where charges of pixels of the third pixel row are moved.

As illustrated in FIG. 3D, the charges (charges R1, R3, . . . ) of the odd-numbered pixels of the third pixel row 12 that are accumulated in the accumulation portions CK1 of the sixth CCD register 20 are vertically transferred and accumulated in the accumulation portions CK1 of the fifth CCD register 19 in accordance with the ON/OFF control of CK1 pulses and the ON/OFF control of the respective TG gates of the TG gate portion 36. The charges (charges R2, R4, . . . ) of the even-numbered pixels of the third pixel row 12 that are accumulated in the accumulation portions CK2 of the sixth CCD register 20 are horizontally transferred and accumulated in the accumulation portions CK1 of the sixth CCD register 20 in accordance with the ON/OFF control of CK2 pulses.

As a result, as illustrated in FIG. 3D, the charges (charges. R1, R3, . . . ) of the odd-numbered pixels of the third pixel row 12 are held in the fifth CCD register 19, and the charges (charges R2, R4, . . . ) of the even-numbered pixels of the third pixel row 12 are held in the sixth CCD register 20.

Figure 5:
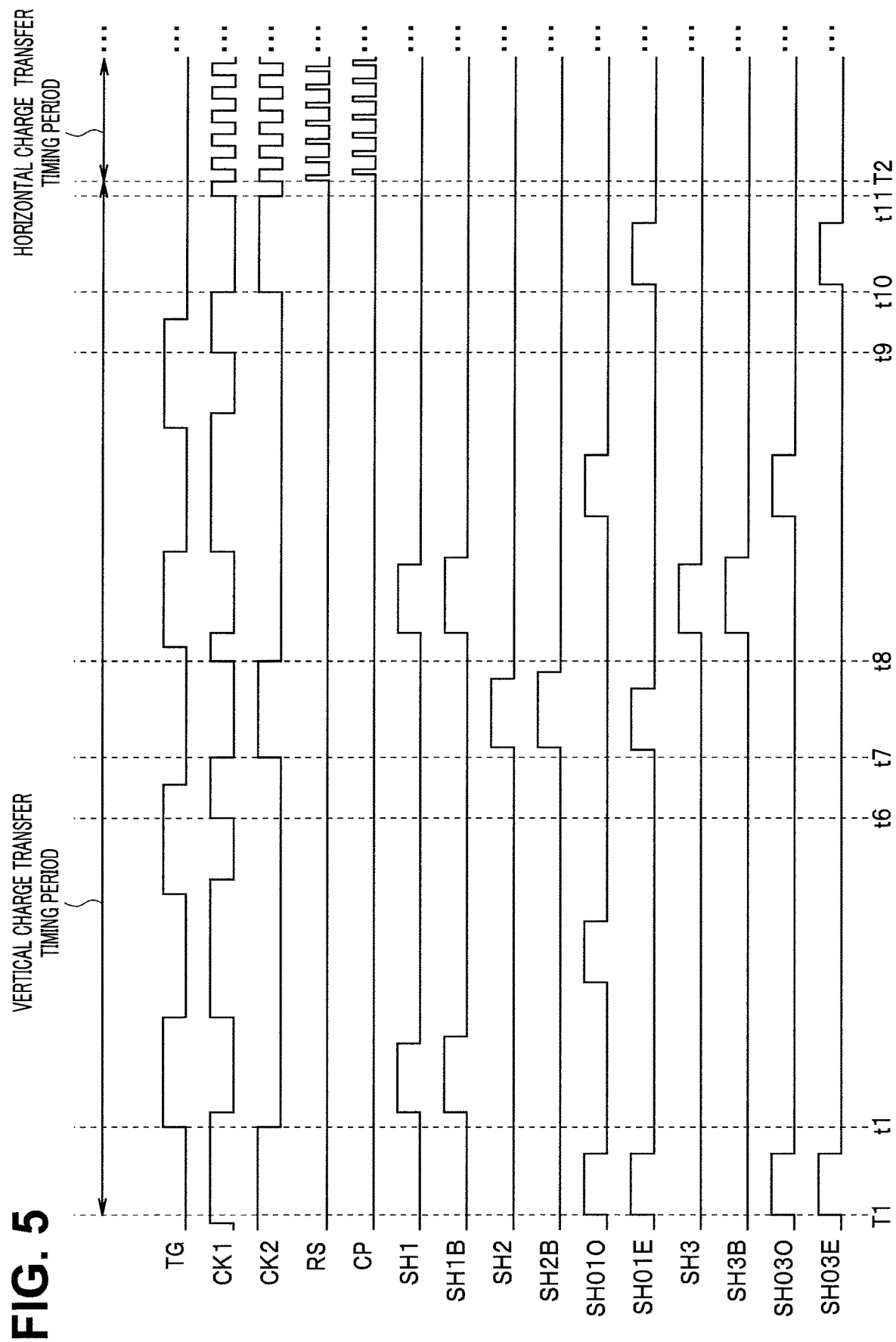
FIG. 5 is a waveform chart illustrating an example of a pulse timing of charge transfer in the first embodiment.

FIG. 4 is a waveform chart illustrating an example of a pulse timing of charge transfer in the related art. FIG. 5 is a waveform chart illustrating an example of a pulse timing of charge transfer in the first embodiment.

In FIGS. 4 and 5, TG represents a TG pulse input to each of the TG gates of the TG gate portions 31, 32, 33, 34, 36, and 37.

CK1 represents a CK1 pulse (first control pulse) input to each of the accumulation portions CK1 of the first CCD register 15, the second CCD register 16, the third CCD register 17, the fourth CCD register 18, the fifth CCD register 19, and the sixth CCD register 20.

CK2 represents a CK2 pulse (second control pulse) input to each of the accumulation portions CK2 of the first CCD register 15, the second CCD register 16, the third CCD register 17, the fourth CCD register 18, the fifth CCD register 19, and the sixth CCD register 20.

RS represents a RS pulse input to each of the first FD portion 39, the second FD portion 40, the third FD portion 41, the fourth FD portion 42, the fifth FD portion 43, and the sixth FD portion 44.

CP represents a CP pulse input to each of the first clamping circuit 45, the second clamping circuit 46, the third clamping circuit 47, the fourth clamping circuit 48, the fifth clamping circuit 49, and the sixth clamping circuit 50.

The TG pulse, the CK1 pulse, the CK2 pulse, the RS pulse, and the CP pulse are generated by the timing generator circuit 52.

In FIGS. 4 and 5, SH1 and SH1B represent an SH1 pulse and an SH1B pulse input to the SH1 gate 23 and the SH1B gate 24, respectively.

SH2 and SH2B represent an SH2 pulse and an SH2B pulse input to the SH2 gate 25 and the SH2B gate 26, respectively.

SH01O and SH01E represent an SH01O pulse and an SH01E pulse input to the SH01O gate and the SH01E gate of the SH01O/SH01E gate 29, respectively.

SH3 and SH3B represent an SH3 pulse and an SH3B pulse input to the SH3 gate 27 and the SH3B gate 28, respectively.

SH03O and SH03E represent an SH03O pulse and an SH03E pulse input to the SH03O gate and the SH03E gate of the SH03O/SH03E gate 30, respectively.

The SH1 pulse, the SH1B pulse, the SH2 pulse, the SH2B pulse, the SH01O pulse, the SH01E pulse, the SH3 pulse, the SH3B pulse, the SH03O pulse, and the SH03E pulse are generated by the logic circuit 51.

As illustrated in FIGS. 4 and 5, charge transfer is executed in order of a vertical charge transfer timing period and a horizontal charge transfer timing period. In the examples of FIGS. 4 and 5, a period from time T1 to time T2 is the vertical charge transfer timing period.

First, during dark charge transfer, at time T1, the SH01 pulse, the SH01E pulse, the SH03O pulse, and the SH03E pulse are Hi, and the SH01O gate, the SH01E gate, the SH03O gate, and the SH03E gate are turned on. As a result, dark charges accumulated in the first ST portion 13 are transferred to the accumulation portions CK1 and CK2 of the fourth CCD register 18, and dark charges accumulated in the second ST portion 14 are transferred to the accumulation portions CK1 and CK2 of the sixth CCD register 20. The dark charges transferred to the accumulation portions CK1 and CK2 of the fourth CCD register 18 are transferred and discharged to the first drain portion 21 during the vertical charge transfer timing period. On the other hand, the dark charges transferred to the accumulation portions CK1 and CK2 of the sixth CCD register 20 are transferred and discharged to the second drain portion 22 during the vertical charge transfer timing period.

During the vertical charge transfer timing period after the dark charge transfer, as illustrated in FIG. 4, an Hi period of the CK1 pulse and an Hi period of the CK2 pulse overlap each other, which causes a phenomenon (blooming) in which charges leak to one-bit-prior pixels in the CCD register to occur. Specifically, during a period from time t2 to t3 and a period from time t4 to t5, the Hi period of the CK1 pulse and the Hi period of the CK2 pulse overlap each other. As a result, the phenomenon (blooming) in which charges leak to one-bit-prior pixels in the CCD register is likely to occur. In addition, when the Hi period of the CK1 pulse and the Hi period of the CK2 pulse are shifted in order to avoid the phenomenon (blooming) in which charges leak to one-bit-prior pixels in the CCD register, the vertical transfer time increases.

On the other hand, during the vertical charge transfer timing period in the embodiment, as illustrated in FIG. 5, the Hi period of the CK1 pulse and the Hi period of the CK2 pulse overlap each other during a period from time T1 to time t1. Even when blooming occurs during the dark charge transfer period, the dark charges are discarded, and thus there are no problems. After time t1, the Hi period of the CK1 pulse is configured not to overlap the Hi period of the CK2 pulse in order to avoid the phenomenon (blooming) in which charges leak to one-bit-prior pixels in the CCD register. Specifically, at time t6, the CK1 pulse is made Hi.

Next, at time t7, the CK1 pulse is made Low, and the CK2 pulse is made Hi. Next, at time t8, the CK2 pulse is made Low. Likewise, at time t9, the CK1 pulse is made Hi. Next, at time t10, the CK1 pulse is made Low, and the CK2 pulse is made Hi. Next, at time t11, the CK2 pulse is made Low.

As a result, by avoiding the phenomenon (blooming) in which charges leak to one-bit-prior pixels in the CCD register, a decrease in saturated charge amount can be avoided, and the vertical transfer time does not increase.

Accordingly, in the solid-state image pickup device according to the embodiment, blooming and a decrease in saturated charge amount can be avoided without increasing the vertical transfer time.

Second Embodiment

Next, a second embodiment will be described.

Figure 6:
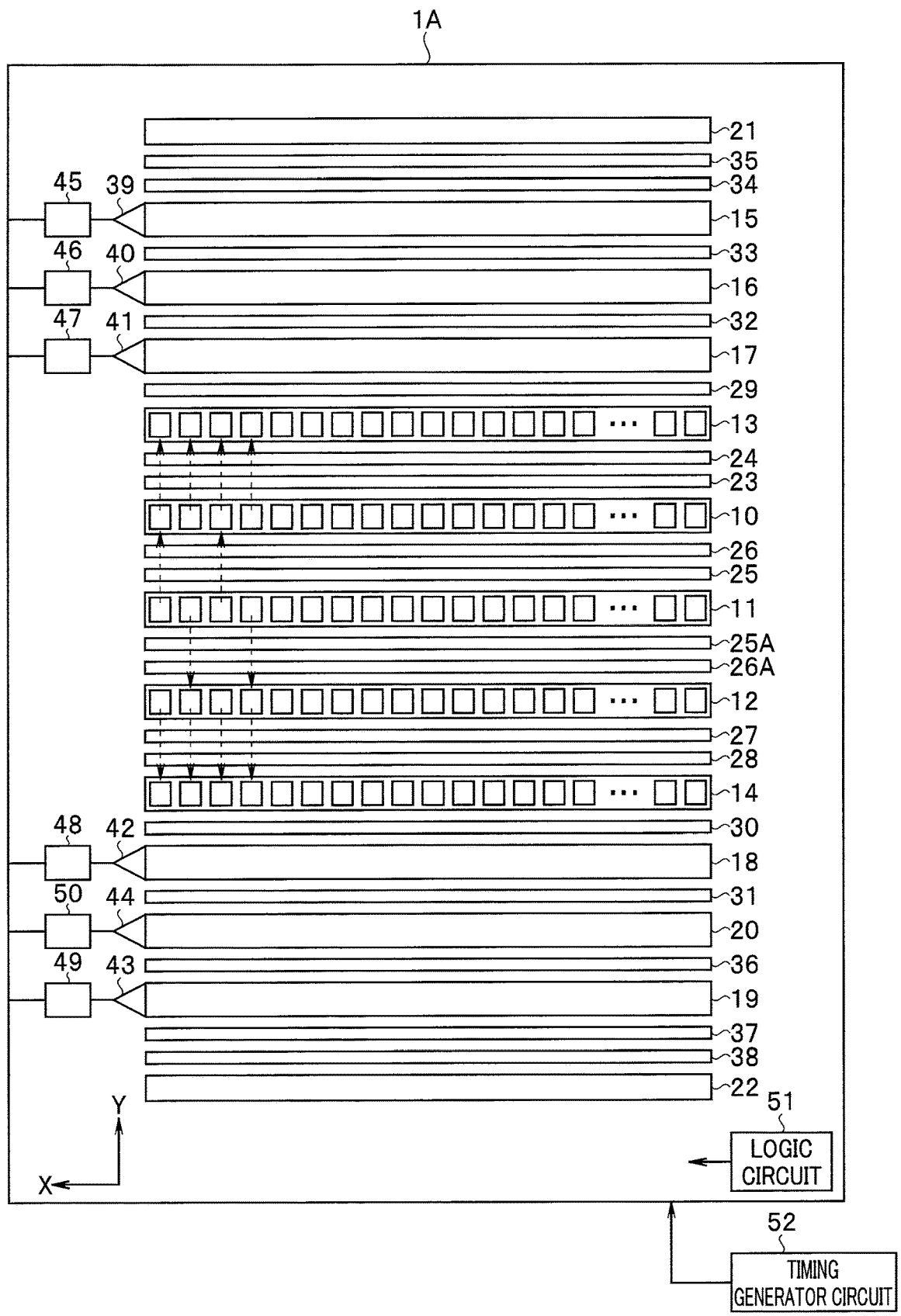
FIG. 6 is a diagram illustrating an example of a configuration of a solid-state image pickup device according to a second embodiment.

FIG. 6 is a diagram illustrating an example of a configuration of a solid-state image pickup device according to the second embodiment. In FIG. 6, the same components as those of FIG. 1 are represented by the same reference numerals, and the description thereof will not be repeated.

As illustrated in FIG. 6, in a solid-state image pickup device 1A, the charges of the odd-numbered pixels of the second pixel row 11 are vertically transferred in the first direction, and the charges of the even-numbered pixels of the second pixel row 11 are vertically transferred in the second direction. Therefore, in the solid-state image pickup device 1A, an SH2 gate 25A and an SH2B gate 26A for vertical transferring the charges of the even-numbered pixels of the second pixel row 11 in the second direction are arranged between the second pixel row 11 and the third pixel row 12.

In the solid-state image pickup device 1A, the fourth CCD register 18 for accumulating the charges of the even-numbered pixels of the second pixel row 11 is arranged below the SH03O/SH03E gate 30. The TG gate portion 31 is arranged between the fourth CCD register 18 and the sixth CCD register 20.

Figure 7:
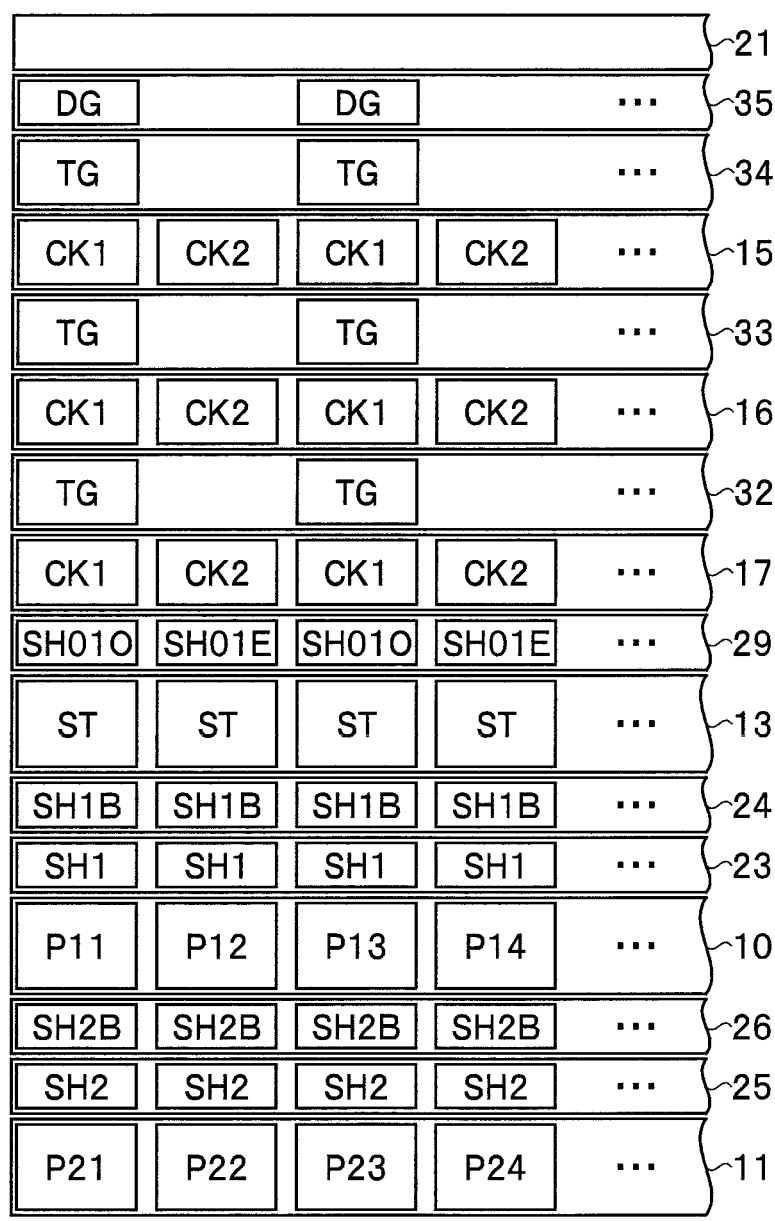
FIG. 7 is a schematic diagram illustrating an example of a specific configuration of an upper portion of the second pixel row regarding vertical charge transfer.
Figure 8:
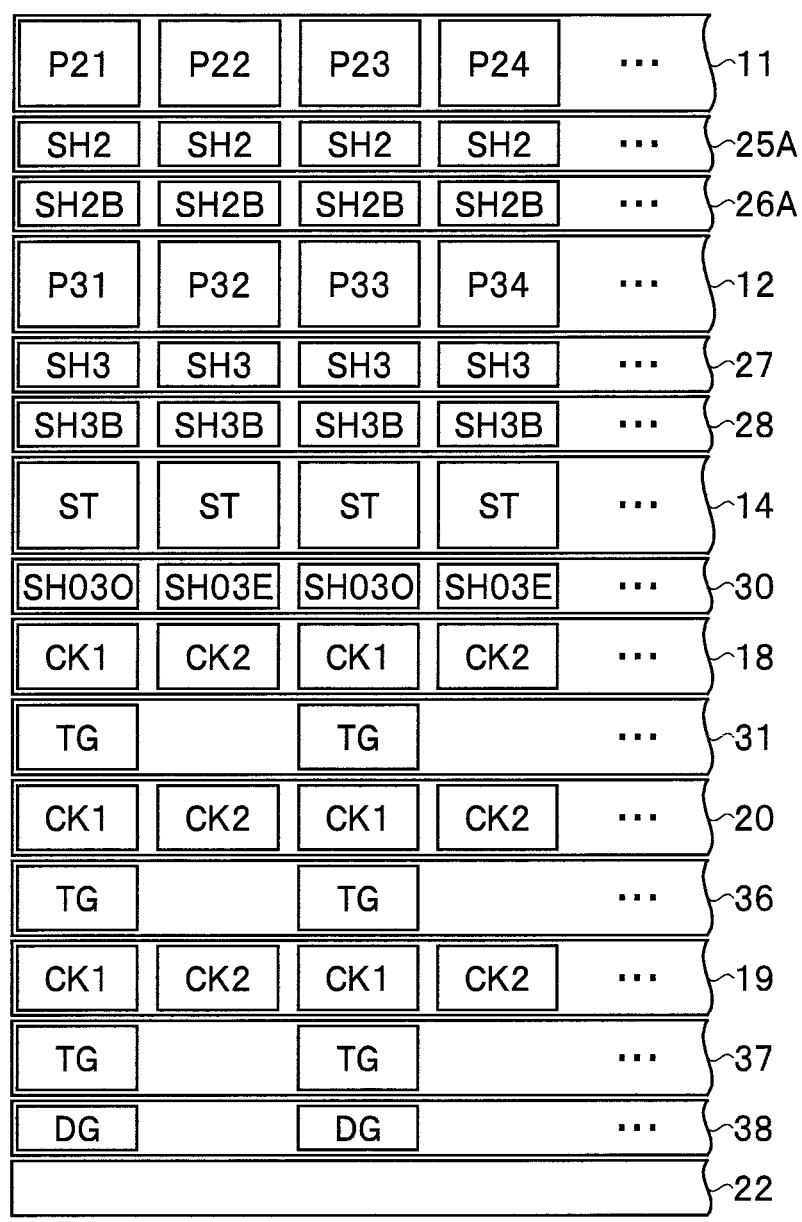
FIG. 8 is a schematic diagram illustrating an example of a specific configuration of a lower portion of the second pixel row regarding vertical charge transfer.

FIG. 7 is a schematic diagram illustrating an example of a specific configuration of an upper portion of the second pixel row regarding vertical charge transfer. FIG. 8 is a schematic diagram illustrating an example of a specific configuration of a lower portion of the second pixel row regarding vertical charge transfer. In FIGS. 7 and 8, the same components as those of FIGS. 2 and 3 are represented by the same reference numerals, and the description thereof will not be repeated.

In the embodiment, the fourth CCD register 18 and the TG gate portion 31 are removed from the upper portion of the second pixel row 11 in FIG. 2. The charges accumulated in the first ST portion 13 are transferred to the third CCD register 17 in accordance with the ON/OFF control of the SH01O/SH01E gate 29. Other configurations are the same as those of FIG. 2.

As illustrated in FIG. 8, the SH2 gate 25A and the SH2B gate 26A are arranged between the second pixel row 11 and the third pixel row 12. Further, the fourth CCD register 18 is arranged below the SH03O/SH03E gate 30. The TG gate portion 31 is arranged below the fourth CCD register 18.

The SH2 gate 25A and the SH2B gate 26A are gates for reading the charges of the even-numbered pixels (pixels P22, P24, . . . ) of the second pixel row 11 in the second direction. The charges accumulated in the even-numbered pixels of the second pixel row 11 are transferred to the second ST portion 14 in accordance with the ON/OFF control of the SH2 gate 25A and the SH2B gate 26A and the ON/OFF control of the SH3 gate 27 and the SH3B gate 28. Other configurations are the same as those of FIG. 3.

In the embodiment, as described above, the charges of the odd-numbered pixels (pixels P21, P23, . . . ) of the second pixel row 11 are vertically transferred in the first direction, and the charges of the even-numbered pixels (P22, P24, . . . ) of the second pixel row 11 are vertically transferred in the second direction.

Therefore, the SH2 gate 25 and the SH2B gate 26 for vertically transferring the charges of the odd-numbered pixels of the second pixel row 11 in the first direction are arranged above the second pixel row 11, and the SH2 gate 25A and the SH2B gate 26A for vertically transferring the charges of the even-numbered pixels of the second pixel row 11 in the second direction are arranged below the second pixel row 11. In other words, the SH2 gate 25 and the SH2B gate 26 are arranged adjacent to the second pixel row 11 in the first direction, and the SH2 gate 25A and the SH2B gate 26A are arranged adjacent to the second pixel row 11 in the second direction opposite to the first direction by 180°.

In the first embodiment, the charges of the even-numbered pixels of the second pixel row 11 are vertically transferred in the first direction. Therefore, the fourth CCD register 18 that accumulates the charges of the even-numbered pixels of the second pixel row 11 is arranged above the second pixel row 11.

On the other hand, in the second embodiment, the charges of the even-numbered pixels of the second pixel row 11 are vertically transferred in the second direction. Therefore, the fourth CCD register 18 that accumulates the charges of the even-numbered pixels of the second pixel row 11 is arranged below the second pixel row 11.

Figure 9:
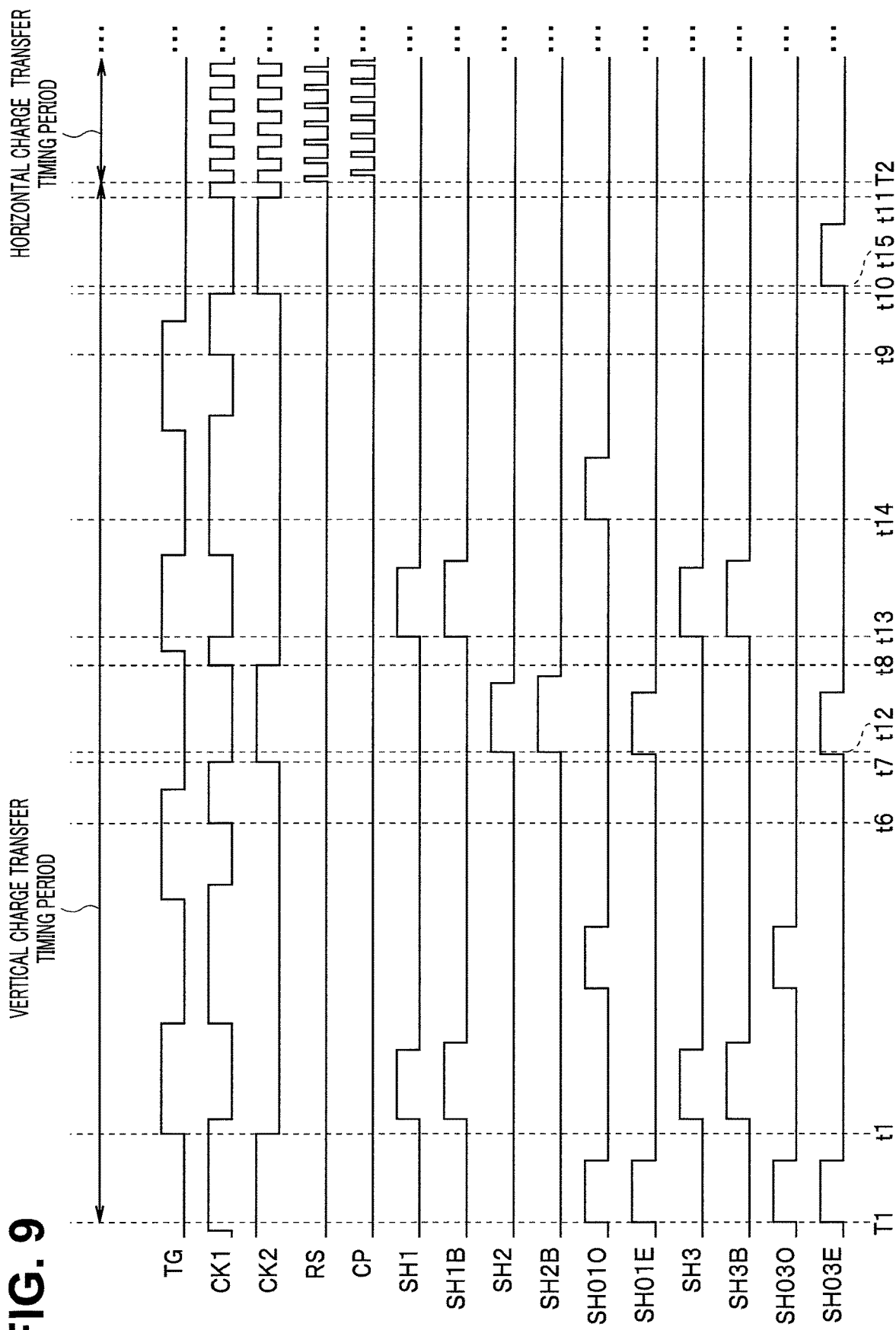
FIG. 9 is a waveform chart illustrating an example of a pulse timing of charge transfer in the second embodiment.

FIG. 9 is a waveform chart illustrating an example of a pulse timing of charge transfer in the second embodiment.

In the second embodiment, the control of the CK1 pulse and the CK2 pulse at the vertical charge transfer pulse timing is the same as that of the first embodiment. In other words, during a period of times t6, t7, and t8 and a period of times t9, t10, and t11, the Hi period of the CK1 pulse is configured not to overlap the Hi period of the CK2 pulse. As a result, as in the first embodiment, the phenomenon (blooming) in which charges leak to one-bit-prior pixels in the CCD register can be avoided, and the vertical transfer time does not increase.

In the embodiment, the charges of the odd-numbered pixels of the second pixel row 11 are vertically transferred in the first direction, and the charges of the even-numbered pixels of the second pixel row 11 are vertically transferred in the second direction. Therefore, the control of the SH1 pulse, the SH1B pulse, the SH2 pulse, the SH2B pulse, the SH01O pulse, the SH01E pulse, the SH3 pulse, the SH3B pulse, the SH03O pulse, and the SH03E pulse is different from that of the first embodiment.

Specifically, at time t12, by setting the SH2 pulse and the SH2B pulse to ON, the charges of the odd-numbered pixels of the second pixel row 11 are transferred to the first pixel row 10, and the charges of the even-numbered pixels of the second pixel row 11 are transferred to the third pixel row 12.

Next, at time t13, by setting the SH1 pulse, the SH1B pulse, the SH3 pulse, and the SH3B pulse to ON, the charges of the odd-numbered pixels of the second pixel row 11 that are transferred to the first pixel row 10 are transferred to the first ST portion 13. Likewise, the charges of the even-numbered pixels of the second pixel row 11 that are transferred to the third pixel row 12 are transferred to the second ST portion 14.

Next, at time t14, by setting the SH01O pulse to ON, the charges of the odd-numbered pixels of the second pixel row 11 that are transferred to the first ST portion 13 are transferred to the accumulation portions CK1 of the third CCD register 17.

Next, at time t15, by setting the SH03E pulse to ON, the charges of the even-numbered pixels of the second pixel row 11 that are transferred to the second ST portion 14 are transferred to the accumulation portions CK2 of the fourth CCD register 18.

Accordingly, in the solid-state image pickup device 1A according to the second embodiment, as in the first embodiment, blooming and a decrease in saturated charge amount can be avoided without increasing the vertical transfer time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image pickup device comprising a first pixel row, a second pixel row, and a third pixel row that are arranged in a horizontal direction, in which a distance between the first pixel row and the second pixel row and a distance between the second pixel row and the third pixel row are two lines, the solid-state image pickup device further comprising:
    a first CCD register configured to hold charges of odd-numbered pixels of the first pixel row;
    a second CCD register configured to hold charges of even-numbered pixels of the first pixel row;
    a third CCD register configured to hold charges of odd-numbered pixels of the second pixel row;
    a fourth CCD register configured to hold charges of even-numbered pixels of the second pixel row;
    a fifth CCD register configured to hold charges of odd-numbered pixels of the third pixel row; and
    a sixth CCD register configured to hold charges of even-numbered pixels of the third pixel row, wherein
    a first control pulse for transferring charges of first accumulation portions of the fourth and sixth CCD registers in a vertical direction perpendicular to the horizontal direction and a second control pulse for transferring charges of second accumulation portions of the fourth and sixth CCD registers in the horizontal direction are input to the fourth and sixth CCD registers such that an Hi period of the first control pulse and an Hi period of the second control pulse do not overlap each other in a timing period in which charges accumulated in the first, second, and third pixel rows are transferred.

2. The solid-state image pickup device according to claim 1, wherein
    first transfer gates that read charges of odd-numbered pixels and even-numbered pixels of the first pixel row are arranged adjacent to the first pixel row in a first direction,
    second transfer gates that read charges of odd-numbered pixels of the second pixel row are arranged adjacent to the second pixel row in the first direction, third transfer gates that read charges of even-numbered pixels of the second pixel row are arranged adjacent to the second pixel row in a second direction opposite to the first direction, and fourth transfer gates that read charges of odd-numbered pixels and even-numbered pixels of the third pixel row are arranged adjacent to the third pixel row in the second direction.

3. The solid-state image pickup device according to claim 2, wherein the first CCD register, the second CCD register, and the third CCD register are arranged in the first direction, and the fourth CCD register, the fifth CCD register, and the sixth CCD register are arranged in the second direction.

4. The solid-state image pickup device according to claim 1, further comprising:

a first storage portion;

a second storage portion;

a first drain portion for discharging dark charges accumulated in the first storage portion; and a second drain portion for discharging dark charges accumulated in the second storage portion.

5. The solid-state image pickup device according to claim 1, wherein the first pixel row is a pixel row corresponding to blue, the second pixel row is a pixel row corresponding to green, and the third pixel row is a pixel row corresponding to red.

6. A control method of a solid-state image pickup device, the solid-state image pickup device including a first pixel row, a second pixel row, and a third pixel row that are arranged in a horizontal direction and further including a first CCD register configured to hold charges of odd-numbered pixels of the first pixel row, a second CCD register configured to hold charges of even-numbered pixels of the first pixel row, a third CCD register configured to hold charges of odd-numbered pixels of the second pixel row, a fourth CCD register configured to hold charges of even-numbered pixels of the second pixel row, a fifth CCD register configured to hold charges of odd-numbered pixels of the third pixel row, and a sixth CCD register configured to hold charges of even-numbered pixels of the third pixel row, in which a distance between the first pixel row and the second pixel row and a distance between the second pixel row and the third pixel row are two lines, the control method comprising inputting to the fourth and sixth CCD registers a first control pulse for transferring charges of first accumulation portions of the fourth and sixth CCD registers in a vertical direction perpendicular to the horizontal direction and a second control pulse for transferring charges of second accumulation portions of the fourth and sixth CCD registers in the horizontal direction such that an Hi period of the first control pulse and an Hi period of the second control pulse do not overlap each other in a timing period in which charges accumulated in the first, second, and third pixel rows are transferred.

* * * * *